(12) United States Patent
Kobayashi et al.

(10) Patent No.: US 8,567,926 B2
(45) Date of Patent: Oct. 29, 2013

(54) LIQUID-EJECTING HEAD, LIQUID-EJECTING APPARATUS, PIEZOELECTRIC ELEMENT, AND METHOD FOR MANUFACTURING LIQUID-EJECTING HEAD

(75) Inventors: Tomokazu Kobayashi, Shiojiri (JP); Masahisa Nawano, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 25 days.

(21) Appl. No.: 12/983,847

(22) Filed: Jan. 3, 2011

(65) Prior Publication Data
US 2011/0164098 A1 Jul. 7, 2011

(30) Foreign Application Priority Data

Jan. 5, 2010 (JP) ................. 2010-000830
Jul. 6, 2010 (JP) ................. 2010-154317

(51) Int. Cl.
| | |
|---|---|
| B41J 2/045 | (2006.01) |
| H01L 41/00 | (2013.01) |
| H01L 41/18 | (2006.01) |
| H01L 41/187 | (2006.01) |
| H02N 2/00 | (2006.01) |
| C04B 35/495 | (2006.01) |
| C04B 35/00 | (2006.01) |

(52) U.S. Cl.
USPC ........ 347/71; 29/25.35; 310/357; 252/62.9 R; 252/62.9 PZ

(58) Field of Classification Search
USPC ...................................... 310/357
See application file for complete search history.

(56) References Cited

U.S. PATENT DOCUMENTS

| | | | |
|---|---|---|---|
| 5,350,721 A | 9/1994 | Abe et al. | |
| 5,453,262 A | 9/1995 | Dawson et al. | |
| 6,844,659 B2 * | 1/2005 | Ikeda et al. | .......... 310/321 |
| 6,969,157 B2 | 11/2005 | Tomozawa et al. | |
| 7,498,725 B2 | 3/2009 | Iezumi et al. | |
| 7,589,450 B2 | 9/2009 | Takabe et al. | |
| 2005/0224851 A1* | 10/2005 | Nakazawa | .......... 257/295 |
| 2006/0170736 A1* | 8/2006 | Tomozawa et al. | .......... 347/71 |
| 2008/0265718 A1 | 10/2008 | Sakashita et al. | |
| 2008/0278038 A1 | 11/2008 | Kobayashi et al. | |
| 2008/0302658 A1 | 12/2008 | Sasaki et al. | |
| 2009/0230211 A1 | 9/2009 | Kobayashi et al. | |
| 2009/0243438 A1 | 10/2009 | Hamada et al. | |

(Continued)

FOREIGN PATENT DOCUMENTS

| | | |
|---|---|---|
| CN | 1461703 A | 12/2003 |
| CN | 101190846 A | 6/2008 |

(Continued)

OTHER PUBLICATIONS

Zhang, Shan-Tao, Preparation, structures, and multiferroic properties of single phase $Bi_{1-x}La_xFeO_3$ (x = 0–0.40) ceramics, J. Appl. Phys. 100, 114108 (2006), Paragraph 1.*

(Continued)

*Primary Examiner* — Lisa M Solomon
(74) *Attorney, Agent, or Firm* — Kilpatrick Townsend & Stockton LLP

(57) ABSTRACT

A piezoelectric element comprising a first electrode, a piezoelectric layer containing bismuth lanthanum iron and manganese formed above the first electrode, and a second electrode formed above the piezoelectric layer. The piezoelectric layer contains crystals preferentially oriented in a (111) plane.

13 Claims, 28 Drawing Sheets

(56) References Cited

U.S. PATENT DOCUMENTS

| | | |
|---|---|---|
| 2009/0273651 A1* | 11/2009 | Kazama et al. ............. 347/68 |
| 2010/0214372 A1 | 8/2010 | Takabe |
| 2011/0006243 A1* | 1/2011 | Sasaki et al. ......... 252/62.9 PZ |
| 2011/0102514 A1 | 5/2011 | Yonemura |
| 2011/0102517 A1* | 5/2011 | Yonemura et al. ............. 347/71 |
| 2011/0102518 A1 | 5/2011 | Yonemura et al. |
| 2011/0109704 A1 | 5/2011 | Furuya et al. |
| 2011/0164095 A1 | 7/2011 | Nawano et al. |
| 2011/0164096 A1 | 7/2011 | Nawano |
| 2011/0164097 A1 | 7/2011 | Nawano et al. |
| 2011/0216135 A1 | 9/2011 | Yonemura |
| 2011/0221833 A1 | 9/2011 | Yonemura et al. |

FOREIGN PATENT DOCUMENTS

| | | | |
|---|---|---|---|
| EP | 1 741 557 | A2 | 1/2007 |
| EP | 2145975 | A2 | 1/2010 |
| JP | 2001-223404 | A | 8/2001 |
| JP | 2007-287744 | A | 11/2007 |
| JP | 2009-070926 | A | 4/2009 |
| JP | 2009071144 | A * | 4/2009 |
| JP | 2009-113419 | A | 5/2009 |
| JP | 2009-242229 | A | 10/2009 |
| JP | 2009-252789 | A | 10/2009 |
| JP | 2009-252790 | A | 10/2009 |
| JP | 2009231482 | A * | 10/2009 |
| JP | 2010-016010 | A | 1/2010 |
| JP | 2010-016011 | A | 1/2010 |
| JP | 2010-067756 | A | 3/2010 |
| JP | 2010-080733 | A | 4/2010 |

OTHER PUBLICATIONS

Singh, S.K., Room temperature ferroelectric properties of Mn-substituted BiFeO3 thin films deposited on Pt electrodes using chemical solution deposition, Appl. Phys. Lett. 88, 262908 (2006), Paragraphs 3-4.*

Wu, Jiagang, and John Wang. "Effects of SrRuO3 buffer layer thickness on mulitiferroic (Bi0.90La0.10)(Fe0.95Mn0.05)O3 thin films." *Journal of Applied Physics* 106.5 (2009): 054115.

The Extended European Search Report (EESR) mailed on Jun. 20, 2011 in European Patent Application No. 11157439.8, for Seiko Epson Corporation.

* cited by examiner

LIQUID-EJECTING HEAD, LIQUID-EJECTING APPARATUS, PIEZOELECTRIC ELEMENT, AND METHOD FOR MANUFACTURING LIQUID-EJECTING HEAD

CROSS-REFERENCE TO RELATED APPLICATIONS

This application claims the benefit of priority to Japanese Patent Application No. 2010-000830 filed Jan. 5, 2010, and Japanese Patent Application No. 2010-154317 filed Jul. 6, 2010, the contents of which are hereby incorporated by reference in their entirety.

BACKGROUND

1. Technical Field

The present invention relates to a piezoelectric element, a liquid-ejecting head including the piezoelectric element, a liquid-ejecting apparatus including the piezoelectric element, and a method for manufacturing the liquid-ejecting head. The piezoelectric element includes a piezoelectric layer and electrodes through which a voltage is applied to the piezoelectric layer. The piezoelectric element produces a pressure change in a pressure-generating chamber in communication with a nozzle opening.

2. Related Art

One example of piezoelectric elements for use in liquid-ejecting heads includes a piezoelectric layer between two electrodes. The piezoelectric layer is formed of a piezoelectric material having an electromechanical transfer function, such as a crystallized dielectric material. Such a piezoelectric element can be mounted on a liquid-ejecting head as an actuator in a flexural vibration mode. One representative example of liquid-ejecting heads is an ink jet print head. The ink jet print head has a diaphragm as part of a pressure-generating chamber, which communicates with a nozzle opening for ejecting ink droplets. The diaphragm is deformed by a piezoelectric element to pressurize ink in the pressure-generating chamber, thereby ejecting ink droplets from the nozzle opening. A piezoelectric element for use in such an ink jet print head can be manufactured by forming a uniform piezoelectric layer over the entire surface of a diaphragm by a film-forming technique and dividing the piezoelectric layer by lithography into pieces corresponding to each individual pressure-generating chamber.

Examples of the piezoelectric material for such a piezoelectric element include, but are not limited to, lead zirconate titanate (PZT) (see Japanese Unexamined Patent Application Publication No. 2001-223404).

However, lead zirconate titanate (PZT) contains lead. Thus, from the standpoint of environmental protection, there is a demand for a piezoelectric material of a lead-free ferroelectric substance. Examples of the lead-free piezoelectric material include, but are not limited to, $BiFeO_3$, which has a perovskite structure $ABO_3$. However, $BiFeO_3$-based piezoelectric materials have low insulating capacity and sometimes generate leakage current. Although commonly used lead zirconate titanate has been modified to improve its characteristics, the behavior of $BiFeO_3$-based piezoelectric materials is unknown. These problems are not confined to liquid-ejecting heads, including ink jet print heads, and also occur in piezoelectric elements, such as actuators, contained in other apparatuses.

SUMMARY

An advantage of some aspects of the invention is that it provides a lead-free piezoelectric element, a liquid-ejecting head including the lead-free piezoelectric element, a liquid-ejecting apparatus including the lead-free piezoelectric element, and a method for manufacturing the liquid-ejecting head.

In accordance with one aspect of the invention to solve the problems described above, a liquid-ejecting head includes a pressure-generating chamber and a piezoelectric element. The pressure-generating chamber communicates with a nozzle opening. The piezoelectric element includes a first electrode, a piezoelectric layer containing bismuth lanthanum iron-manganese oxide disposed on the first electrode, and a second electrode disposed on the piezoelectric layer. The piezoelectric layer contains crystals preferentially oriented in a (111) plane. This liquid-ejecting head includes the lead-free piezoelectric layer containing bismuth lanthanum iron-manganese oxide and has excellent deformation characteristics.

Preferably, the first electrode includes a platinum layer containing platinum and a strontium titanate (STO) layer containing strontium titanate disposed on the platinum layer, and the piezoelectric layer is disposed on the STO layer. This facilitates the formation of a piezoelectric layer containing crystals preferentially oriented in the (111) plane.

The STO layer may be doped with Nb. This facilitates the formation of a piezoelectric layer containing crystals preferentially oriented in the (111) plane using a STO layer containing Nb-doped strontium titanate (Nb-STO) as an orientation control layer.

Preferably, the first electrode includes a platinum layer containing platinum and a strontium ruthenate (SRO) layer containing strontium ruthenate disposed on the platinum layer, and the piezoelectric layer is disposed on the SRO layer. This facilitates the formation of a piezoelectric layer containing crystals preferentially oriented in the (111) plane.

The first electrode may include an iridium oxide layer containing iridium oxide and a platinum layer containing platinum disposed on the iridium oxide layer, and the piezoelectric layer may be disposed on the platinum layer. This facilitates the formation of a piezoelectric layer containing crystals more preferentially oriented in the (111) plane.

Preferably, the first electrode includes a platinum layer containing platinum and having a half-width of the (111) plane of 10 degrees or less, and the piezoelectric layer is disposed on the platinum layer. This facilitates the formation of a piezoelectric layer containing crystals more preferentially oriented in the (111) plane.

Preferably, the bismuth lanthanum iron-manganese oxide is a complex oxide having a general formula (1) described below. Since the complex oxide having the general formula (1) can have the characteristics of a ferroelectric substance, the liquid-ejecting head can include a lead-free piezoelectric element the strain of which is easy to control. Thus, the liquid-ejecting head can include a piezoelectric element that can easily control the size of droplets ejected.

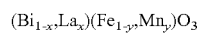

$$(Bi_{1-x}La_x)(Fe_{1-y}Mn_y)O_3$$

$$(0.10 \leq x \leq 0.20, 0.01 \leq y \leq 0.09) \qquad (1)$$

In the general formula (1), x is preferably in the range of $0.17 \leq x \leq 0.20$, more preferably $0.19 \leq x \leq 0.20$, and y is preferably in the range of $0.01 \leq y \leq 0.05$. The piezoelectric element satisfying these conditions can have a large strain.

In accordance with another aspect of the invention, a liquid-ejecting apparatus includes such a liquid-ejecting head as described above. In accordance with this aspect, the liquid-ejecting head includes a lead-free piezoelectric element having excellent deformation characteristics, high insulating capacity, and less frequently occurring leakage current. Thus, the liquid-ejecting apparatus does not adversely affect the environment, less frequently causes dielectric breakdown, and has high reliability.

A piezoelectric element according to another aspect of the invention includes a piezoelectric layer containing bismuth lanthanum iron-manganese oxide and an electrode disposed on the piezoelectric layer, wherein the piezoelectric layer contains crystals preferentially oriented in a (111) plane. Thus, the piezoelectric element is free of lead and has excellent piezoelectricity.

In accordance with still another aspect of the invention, a method for manufacturing a liquid-ejecting head according to the aspect described above includes forming a STO precursor film on the platinum layer, the STO precursor film being a precursor of the STO layer, forming a piezoelectric precursor film on the STO precursor film, the piezoelectric precursor film being a precursor of the piezoelectric layer, and simultaneously firing the STO precursor film and the piezoelectric precursor film to form the STO layer and the piezoelectric layer. A laminate of the STO layer and the piezoelectric layer can be relatively easily manufactured by this method.

In accordance with still another aspect of the invention, a method for manufacturing a liquid-ejecting head according to the aspect described above includes forming the platinum layer on the iridium oxide layer, forming a piezoelectric precursor film on the platinum layer, the piezoelectric precursor film being a precursor of the piezoelectric layer, and firing the piezoelectric precursor film in an inert gas atmosphere to form the piezoelectric layer. This allows a piezoelectric layer containing crystals more preferentially oriented in the (111) plane to be formed relatively easily.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
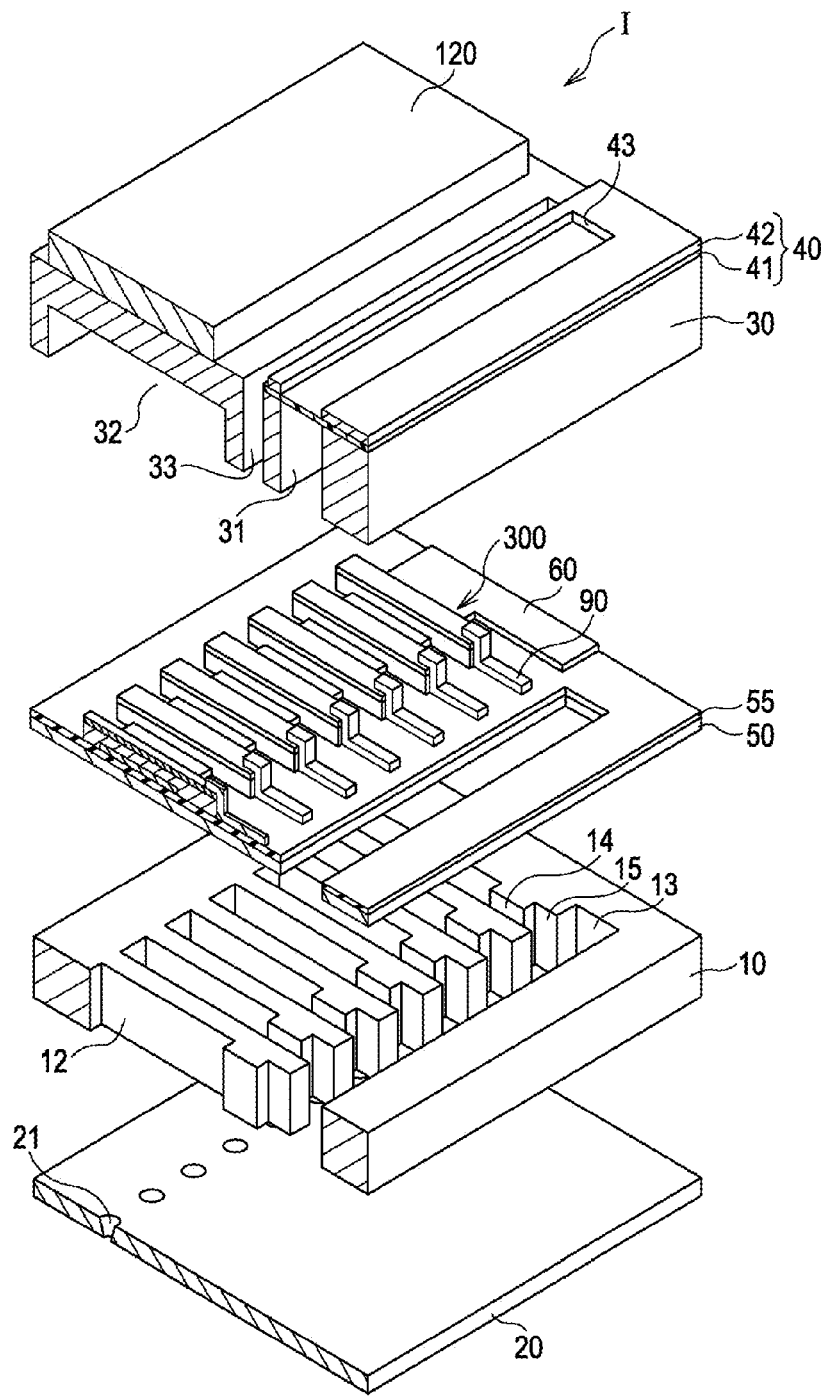
FIG. 1 is a schematic exploded perspective view of a print head according to a first embodiment of the present invention.
Figure 2:
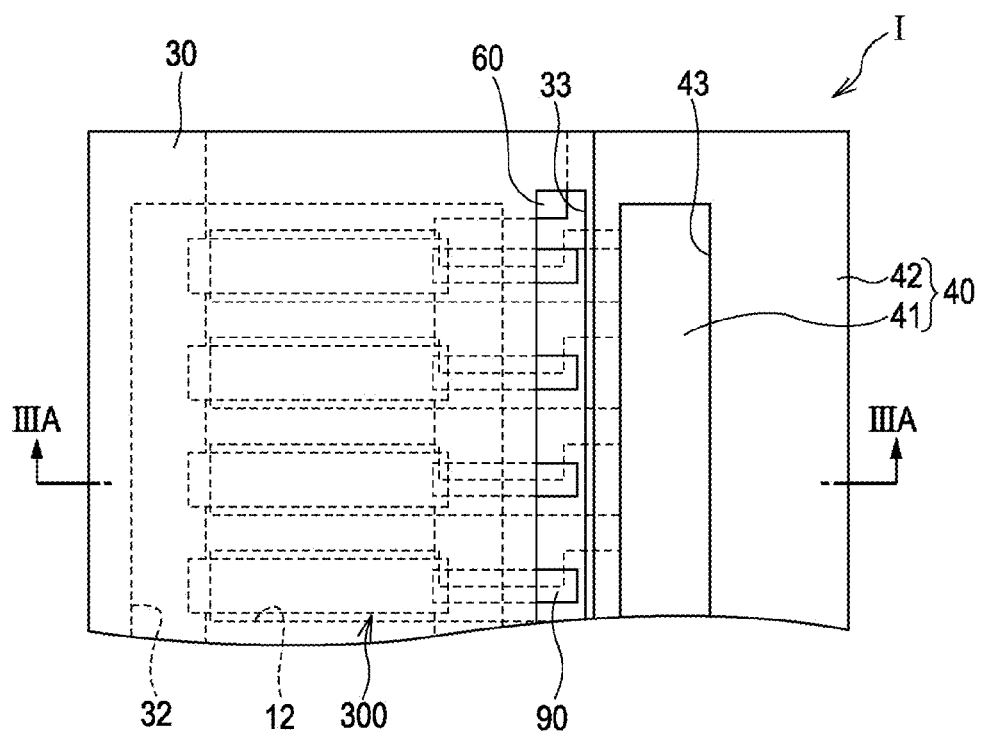
FIG. 2 is a fragmentary plan view of the print head according to the first embodiment of the invention.
Figure 3A:
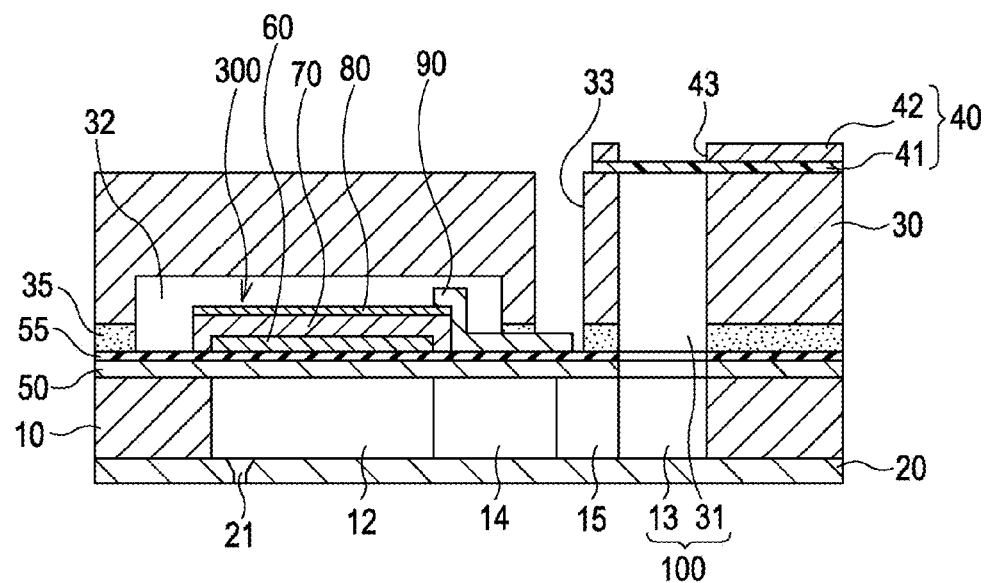
FIG. 3A is a cross-sectional view of the print head according to the first embodiment.
Figure 3B:
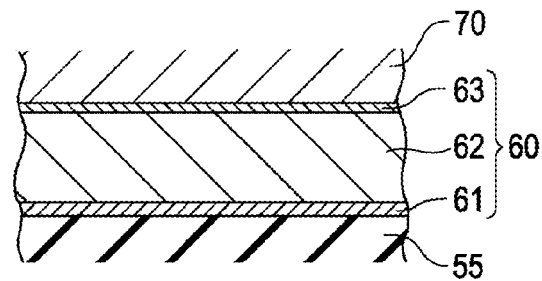
FIG. 3B is an enlarged cross-sectional view of a principal part of the print head according to the first embodiment.
Figure 4:
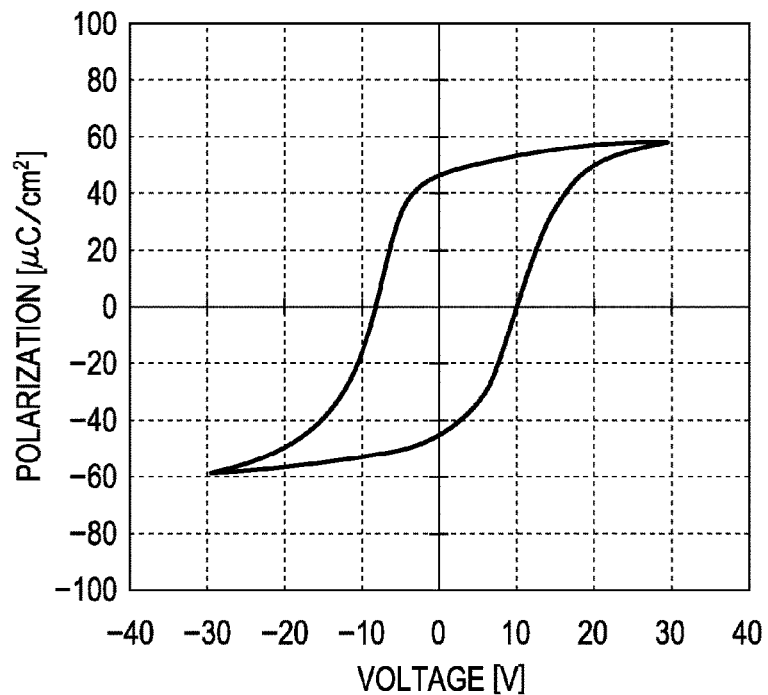
FIG. 4 is a graph showing a P-V curve of a sample 1.
Figure 5:
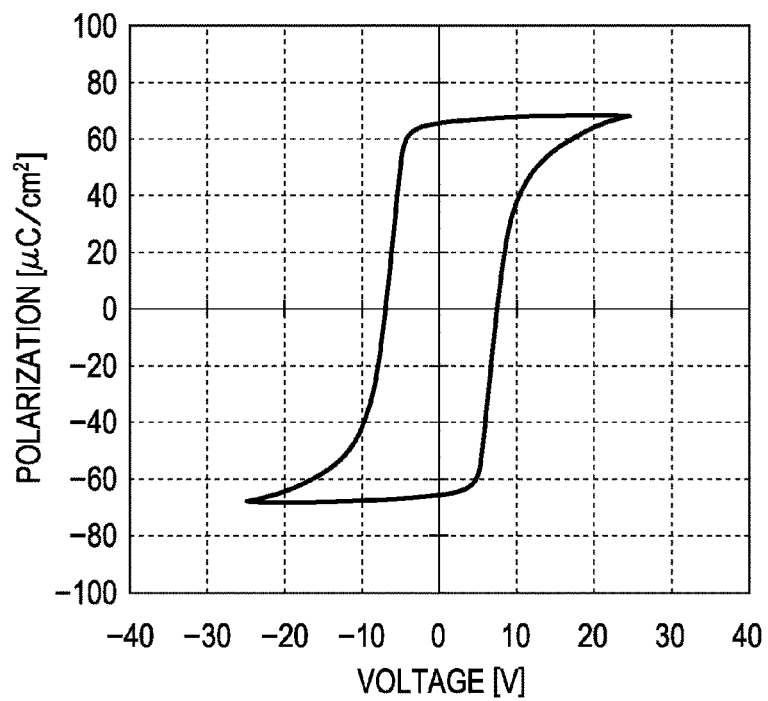
FIG. 5 is a graph showing a P-V curve of a sample 2.
Figure 6:
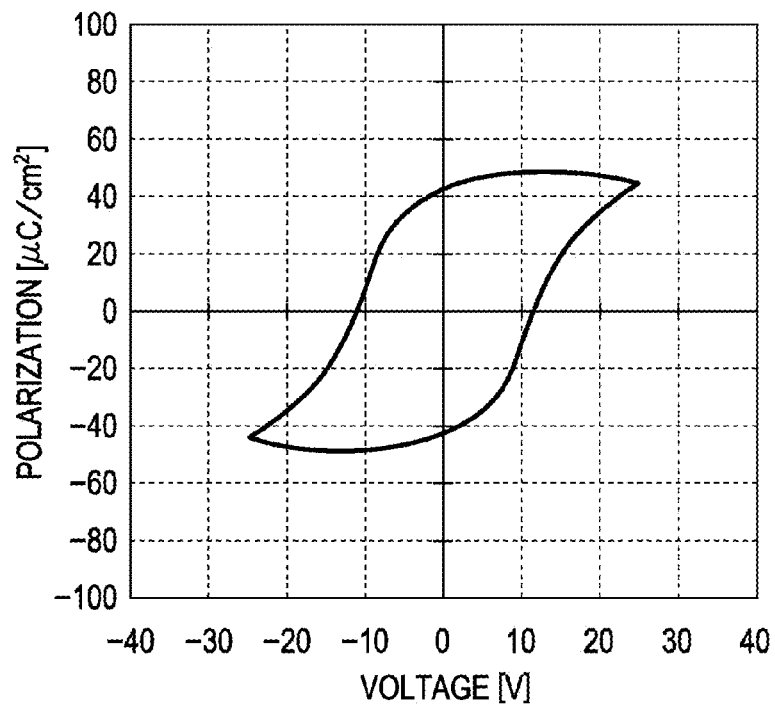
FIG. 6 is a graph showing a P-V curve of a sample 3.
Figure 7:
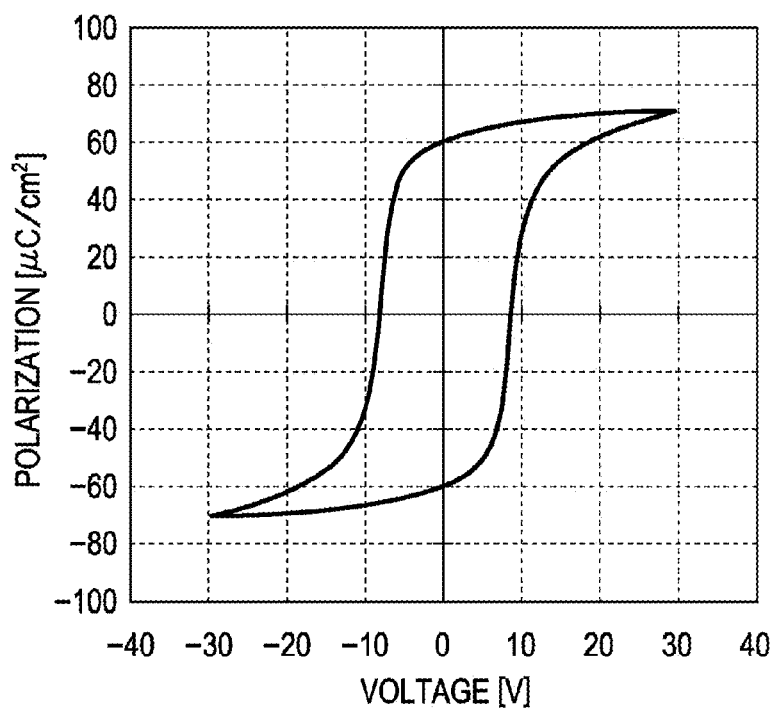
FIG. 7 is a graph showing a P-V curve of a sample 4.
Figure 8:
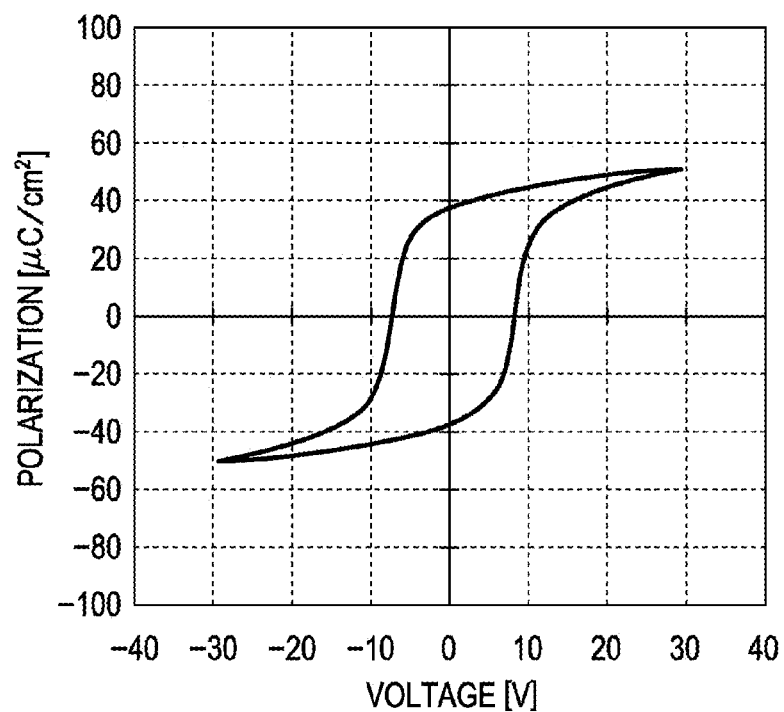
FIG. 8 is a graph showing a P-V curve of a sample 5.
Figure 9:
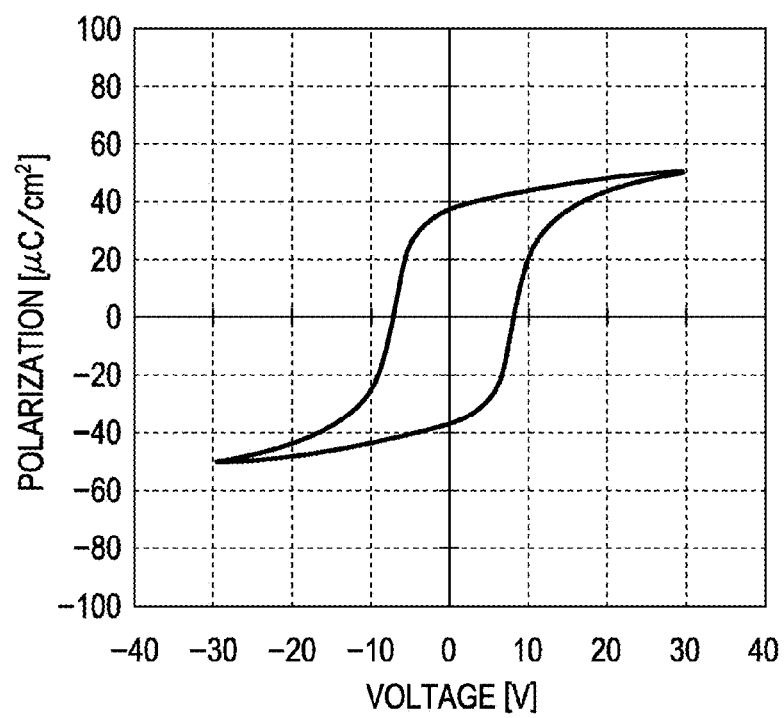
FIG. 9 is a graph showing a P-V curve of a sample 6.
Figure 10:
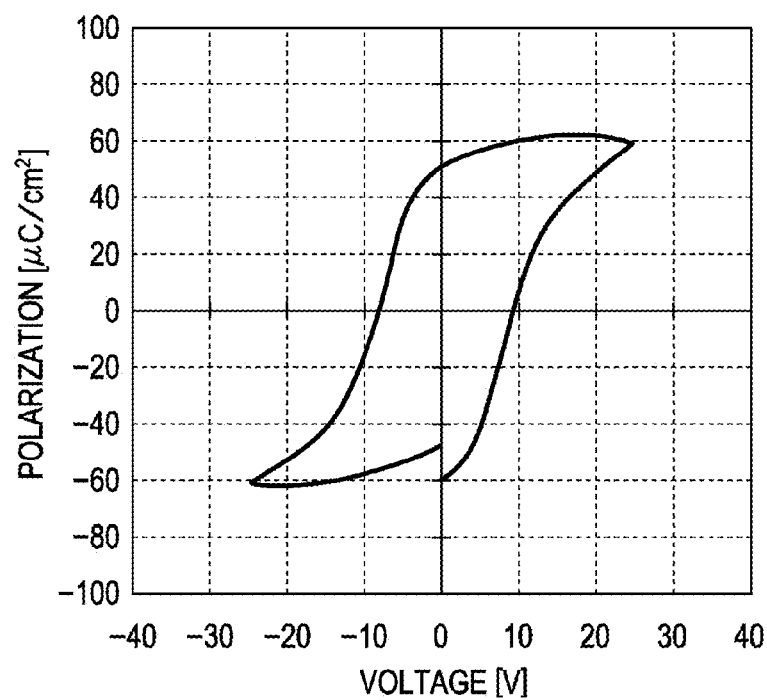
FIG. 10 is a graph showing a P-V curve of a sample 7.
Figure 11:
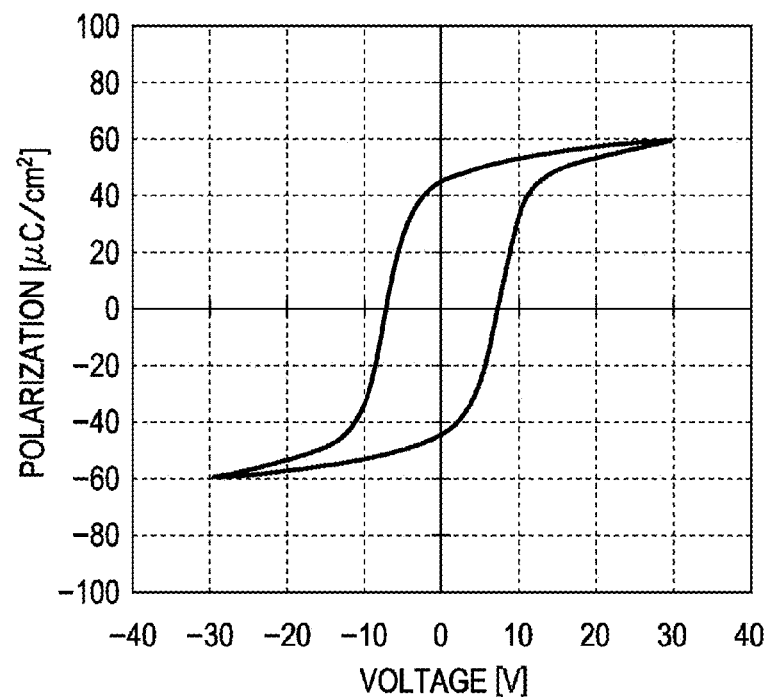
FIG. 11 is a graph showing a P-V curve of a sample 8.
Figure 12:
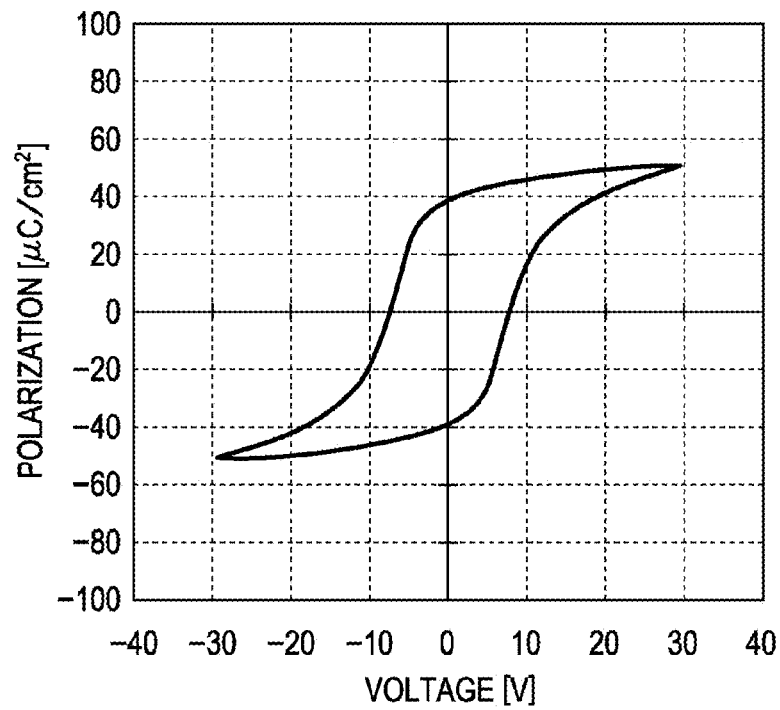
FIG. 12 is a graph showing a P-V curve of a sample 9.
Figure 13:
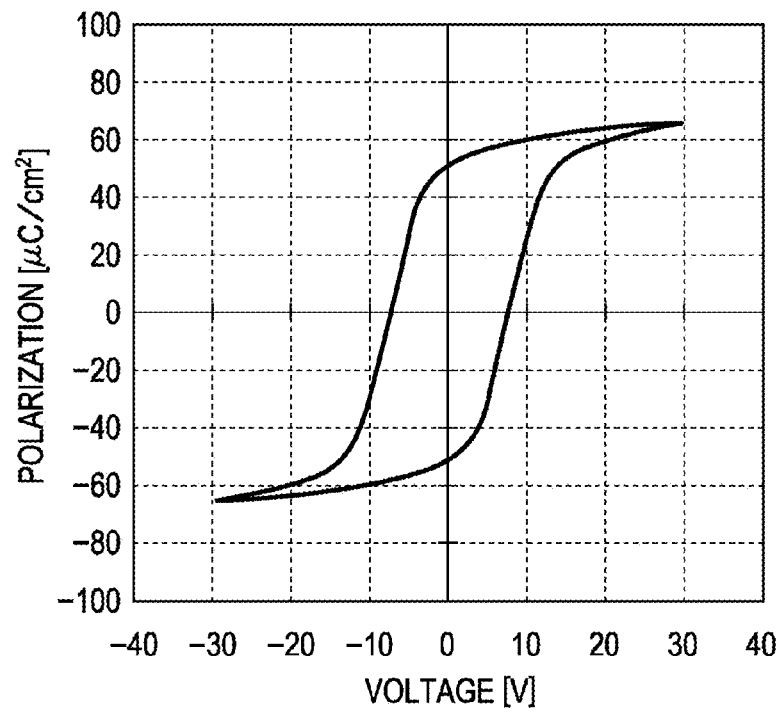
FIG. 13 is a graph showing a P-V curve of a sample 10.
Figure 14:
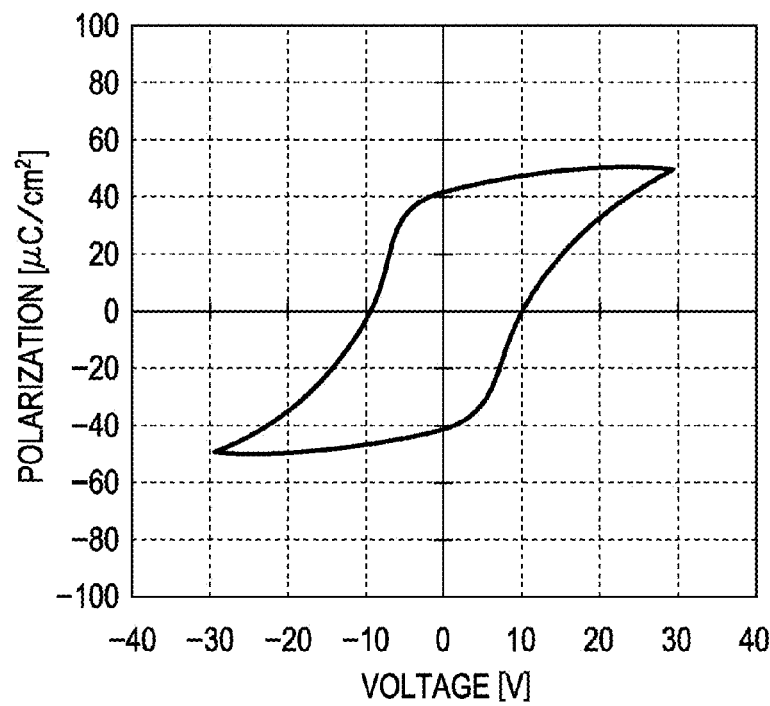
FIG. 14 is a graph showing a P-V curve of a sample 11.

FIG. 1 is a schematic exploded perspective view of an ink jet print head as an example of a liquid-ejecting head manufactured by a method according to a first embodiment of the invention. FIG. 2 is a fragmentary plan view of the print head according to the first embodiment. FIG. 3A is a cross-sectional view of the print head taken along the line IIIA-IIIA in FIG. 2. FIG. 3B is an enlarged cross-sectional view of a principal part of the print head according to the first embodiment.

As illustrated in FIGS. 1 and 3, a flow-passage-forming substrate 10 according to the present embodiment is a silicon single crystal substrate. A silicon dioxide elastic film 50 is disposed on the flow-passage-forming substrate 10.

The flow-passage-forming substrate 10 includes a plurality of pressure-generating chambers 12 juxtaposed to each other in the width direction. The flow-passage-forming substrate 10 further includes a communication portion 13 outside the pressure-generating chambers 12 in the longitudinal direction of the pressure-generating chambers 12. The communication portion 13 communicates with the pressure-generating chambers 12 through corresponding ink feed channels 14 and communication paths 15. The communication portion 13 in communication with a reservoir portion 31 in a protective substrate described below constitutes part of a reservoir, which is a common ink chamber of the pressure-generating chambers 12. The ink feed channels 14 have a smaller width than the pressure-generating chambers 12, producing a constant flow resistance against ink flowing from the communication portion 13 to the pressure-generating chambers 12. While each of the flow passages is narrowed at one side thereof in the present embodiment, each of the flow passages may be narrowed at both sides thereof to form the ink feed channels 14. Alternatively, instead of reducing the width of the flow passages, the thickness of the flow passages may be reduced to form the ink feed channels 14. Thus, the flow-passage-forming substrate 10 includes liquid flow passages, which are composed of the pressure-generating chambers 12, the communication portion 13, the ink feed channels 14, and the communication paths 15.

The bottom surface of the flow-passage-forming substrate 10 is attached to a nozzle plate 20 with an adhesive, a heat-seal film, or the like. The nozzle plate 20 has nozzle openings 21 in communication with the corresponding ends of the pressure-generating chambers 12 opposite the ink feed channels 14. The nozzle plate 20 may be formed of glass ceramic, a silicon single crystal, or stainless steel.

As described above, the elastic film 50 is disposed on the flow-passage-forming substrate 10 opposite the nozzle plate 20. An insulator film 55, for example, formed of zirconium oxide is disposed on the elastic film 50.

A first electrode 60, a piezoelectric layer 70, and a second electrode 80 are formed on the insulator film 55 to constitute a piezoelectric element 300. The piezoelectric layer 70 has a thickness of 2 μm or less, preferably in the range of 0.3 to 1.5 μm. The piezoelectric element 300 refers to a portion that includes the first electrode 60, the piezoelectric layer 70, and the second electrode 80. In general, one of the two electrodes of the piezoelectric element 300 serves as a common electrode, and the other electrode and the piezoelectric layer 70 correspond to each of the pressure-generating chambers 12. In the present embodiment, the first electrode 60 serves as the common electrode for the piezoelectric elements 300 and the second electrodes 80 serve as individual electrodes of the piezoelectric elements 300. Depending on the drive circuitry or wiring, however, first electrodes may serve as individual electrodes and a second electrode may serve as a common electrode. The piezoelectric element 300 in combination with a diaphragm is hereinafter referred to as an actuator. The diaphragm can be deformed by the operation of the piezoelectric element 300. Although the elastic film 50, the insulator film 55, and the first electrode 60 function as the diaphragm in the present embodiment, the diaphragm is not limited to this structure. For example, the ink jet print head I may include no elastic film 50 or insulator film 55, and the first electrode 60 alone may function as the diaphragm. Alternatively, the piezoelectric elements 300 may function as the diaphragm.

In the present embodiment, as illustrated in FIG. 3B, the first electrode 60 includes a titanium oxide layer 61 containing titanium oxide, a platinum layer 62 containing platinum, and a STO layer 63 containing Nb-doped strontium titanate (Nb-STO), layered in this order on the insulator film 55. The platinum layer 62 of the first electrode 60 mainly functions as an electroconductive layer. The titanium oxide layer 61 and the STO layer 63 may therefore have low electrical conductivity.

The STO layer 63 functions as an orientation control layer so that the piezoelectric layer 70 contains crystals preferentially oriented in the (111) plane. Preferably, the STO layer 63 has a thickness in the range of 5 to 10 nm. The STO layer 63 having a thickness below 5 nm may have an insufficient orientation control function. The STO layer 63 having a thickness above 10 nm may have a low dielectric constant and consequently low piezoelectricity. Although the STO layer 63 is formed of Nb-doped strontium titanate (Nb-STO) in the present embodiment, the STO layer 63 may be formed of strontium titanate doped with another element, such as La.

The piezoelectric layer 70 is formed of a piezoelectric material containing bismuth lanthanum iron-manganese oxide, that is, an $ABO_3$ complex oxide containing bismuth (Bi), lanthanum (La), iron (Fe), and manganese (Mn). In the perovskite $ABO_3$ structure, the A sites have oxygen atoms in 12-fold coordination, and the B sites have oxygen atoms in 6-fold coordination, forming an octahedron. Bi and La are located at the A sites, and Fe and Mn are located at the B sites.

In the present embodiment, the piezoelectric layer 70 contains crystals preferentially oriented in the (111) plane. While the piezoelectric layer 70 formed of a piezoelectric material containing bismuth lanthanum iron-manganese oxide is novel, the present inventors first found that the piezoelectric layer 70 contains crystals preferentially oriented in the (111) plane. The crystals preferentially oriented in the (111) plane have higher piezoelectricity than randomly oriented crystals. Use of such a piezoelectric element as a piezoelectric actuator can produce a large strain.

The sentence "crystals are preferentially oriented in a (111) plane", as used herein, includes both cases where all the crystals are oriented in the (111) plane and almost all the crystals (for example, 90% or more) are oriented in the (111) plane.

Although the details are described below, the piezoelectric element according to the present embodiment is fabricated by using a titanium film as the base of a platinum film formed of a platinum precursor of the platinum layer 62, forming the STO layer 63 containing Nb-doped strontium titanate (Nb-STO) as the orientation control layer on the platinum film, and firing and crystallizing a piezoelectric precursor film containing bismuth, lanthanum, iron, and manganese on the STO layer 63 in an inert gas atmosphere to form the piezoelectric layer 70. The piezoelectric layer 70 thus fabricated can contain crystals preferentially oriented in the (111) plane.

Whether or not the crystals of the piezoelectric layer are preferentially oriented in the (111) plane depends on the presence of the orientation control layer, the firing conditions, and other conditions. In the absence of the iridium oxide layer under the platinum layer 62 and the absence of the orientation control layer on the platinum film, firing and crystallizing a piezoelectric precursor film containing bismuth, lanthanum, iron, and manganese even in an inert gas atmosphere does not yield crystals preferentially oriented in the (111) plane but is highly likely to yield randomly orientated crystals. In the presence of the STO layer 63 as the orientation control layer, the firing may be performed under conditions other than the inert atmosphere, such as in the air or in an oxygen atmosphere.

Figure 15:
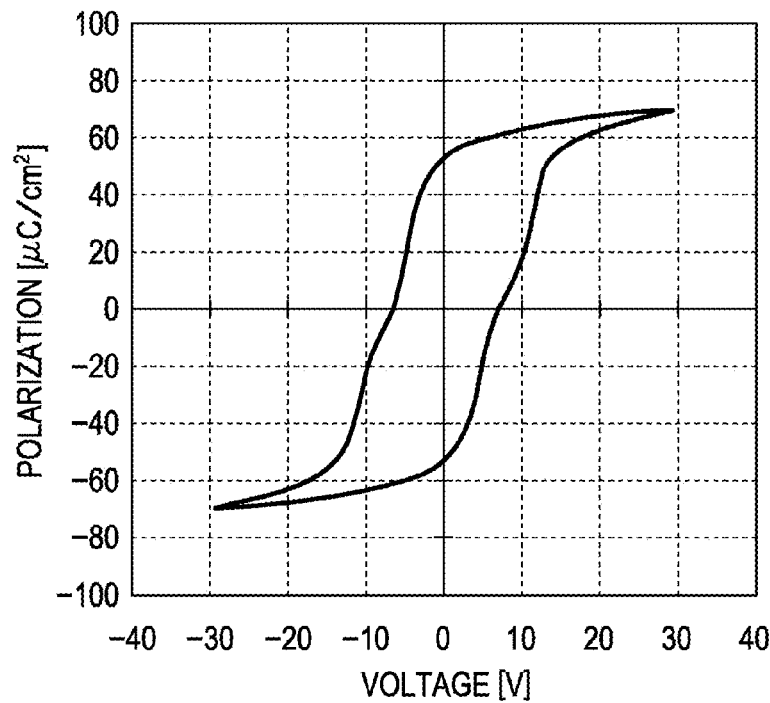
FIG. 15 is a graph showing a P-V curve of a sample 12.
Figure 16:
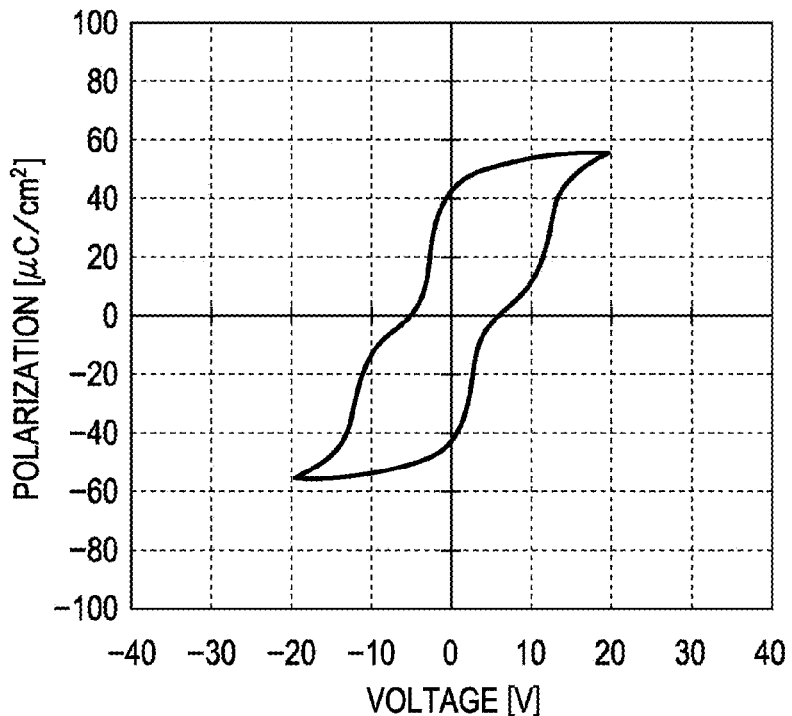
FIG. 16 is a graph showing a P-V curve of a sample 13.
Figure 17:
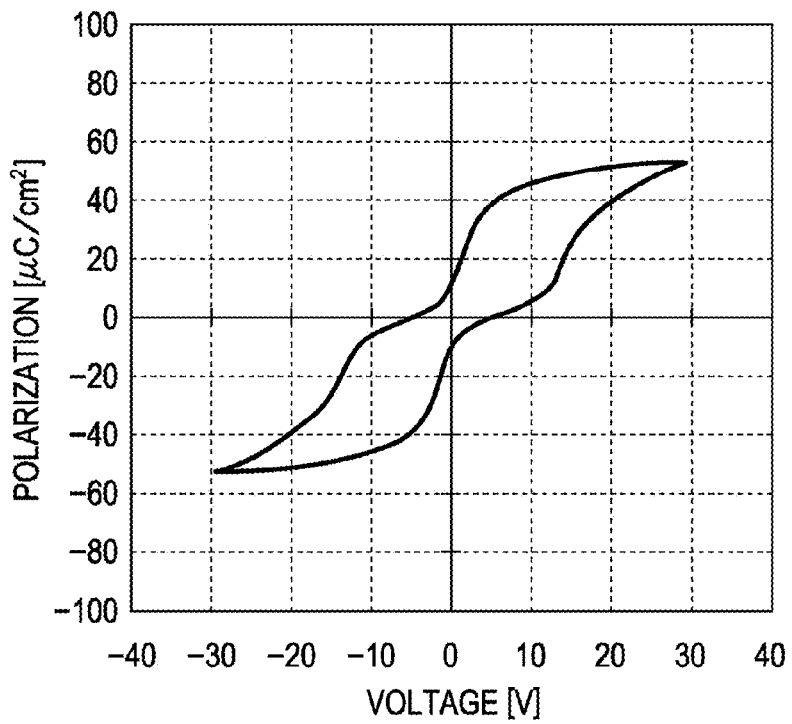
FIG. 17 is a graph showing a P-V curve of a sample 14.
Figure 18:
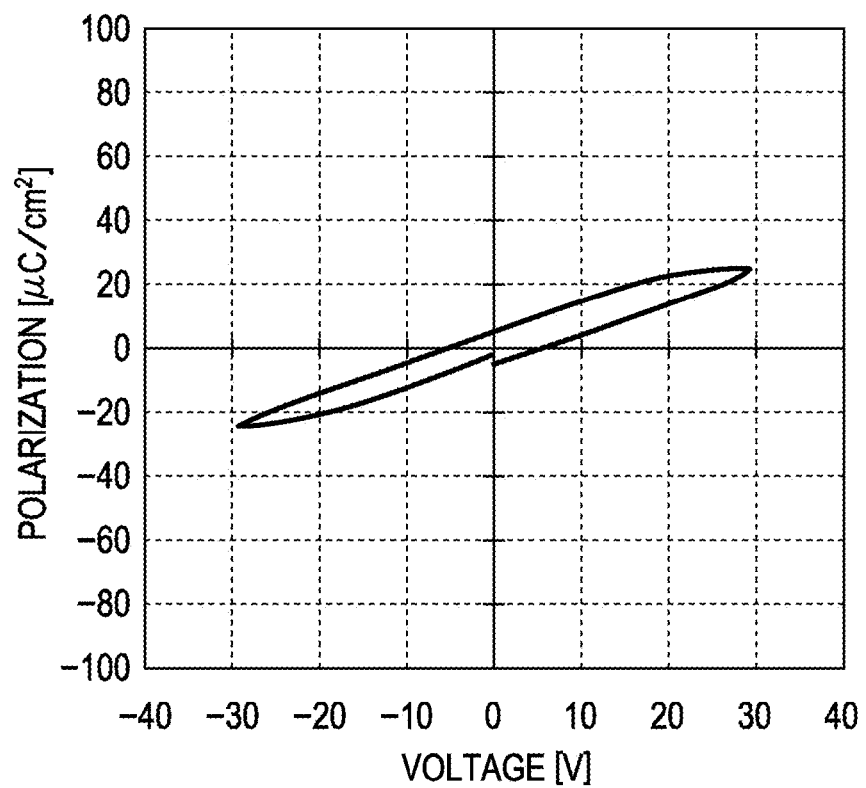
FIG. 18 is a graph showing a P-V curve of a sample 15.

Preferably, the piezoelectric layer 70 containing bismuth (Bi), lanthanum (La), iron (Fe), and manganese (Mn) has a composition expressed by the general formula (1) described below. The piezoelectric layer 70 having a composition expressed by the general formula (1) can be a ferroelectric substance. The piezoelectric layer 70 formed of a ferroelectric substance facilitates the control of the strain of the piezoelectric element. Thus, with a liquid-ejecting head including such a piezoelectric element, the size of ink droplets ejected can be easily controlled. Depending on the composition, an $ABO_3$ complex oxide containing Bi, La, Fe, and Mn exhibited ferroelectric, antiferroelectric, or paraelectric characteristics. Piezoelectric elements (samples 1 to 18) were fabricated, in which the composition of the general formula (1) was altered as shown in Table 1. FIGS. 4 to 18 show the relationship between polarization (P) and voltage (V) when a triangular wave of 25 or 30 V was applied to the samples 1 to 18, respectively. The samples 16 to 18 had too much leakage to determine the relationship and could not be used as piezoelectric materials. As shown in FIGS. 4 to 14, the samples 1 to 11, which satisfied $0.10 \leq x \leq 0.20$ and $0.01 \leq y \leq 0.09$, had a hysteresis loop characteristic of a ferroelectric substance. In the samples 1 to 11, the piezoelectric strain increases linearly with voltage applied and is easy to control. As shown in FIGS. 15 to 17, the samples 12 to 14, which have x and y outside the ranges of $0.10 \leq x \leq 0.20$ and $0.01 \leq y \leq 0.09$ in the general formula (1), have double hysteresis in the positive electric field direction and the negative electric field direction, which is characteristic of an antiferroelectric substance. Thus, the samples 12 to 14 are antiferroelectric substances. As shown in FIG. 18, the sample 15 is a paraelectric material. The samples 16 to 18 could not be used as a piezoelectric material because of excessive leakage, as described above. Thus, the samples 12 to 18 are not ferroelectric.

$$(Bi_{1-x}, La_x)(Fe_{1-y}, Mn_y)O_3$$

$$(0.10 \leq x \leq 0.20, 0.01 \leq y \leq 0.09) \quad (1)$$

TABLE 1

| | x | y |
|---|---|---|
| sample 1 | 0.10 | 0.03 |
| sample 2 | 0.10 | 0.05 |
| sample 3 | 0.10 | 0.09 |
| sample 4 | 0.14 | 0.05 |
| sample 5 | 0.17 | 0.03 |
| sample 6 | 0.18 | 0.03 |
| sample 7 | 0.20 | 0.01 |
| sample 8 | 0.20 | 0.02 |
| sample 9 | 0.19 | 0.03 |
| sample 10 | 0.19 | 0.04 |
| sample 11 | 0.19 | 0.05 |
| sample 12 | 0.21 | 0.03 |
| sample 13 | 0.24 | 0.05 |
| sample 14 | 0.29 | 0.05 |
| sample 15 | 0.48 | 0.05 |
| sample 16 | 0.20 | 0.00 |
| sample 17 | 0.10 | 0.00 |
| sample 18 | 0.00 | 0.00 |

An antiferroelectric substance has adjacent dipoles oriented in antiparallel directions and can undergo electric-field-induced phase transition above a certain voltage. A piezoelectric layer formed of such an antiferroelectric substance can produce a larger strain than a piezoelectric layer formed of a ferroelectric substance. However, the piezoelectric layer formed of an antiferroelectric substance cannot be driven below a certain voltage. In addition, piezoelectric strain does not change linearly with voltage. The term "electric-field-induced phase transition" means phase transition induced by an electric field and includes phase transition from an antiferroelectric phase to a ferroelectric phase and phase transition from a ferroelectric phase to an antiferroelectric phase. The term "ferroelectric phase" means that spontaneous polarization occurs unidirectionally. The term "antiferroelectric phase" means that adjacent dipoles are oriented in antiparallel directions. For example, in phase transition from an antiferroelectric phase to a ferroelectric phase, some adjacent dipoles oriented in antiparallel directions in the antiferroelectric phase are inverted such that the dipoles are oriented unidirectionally. Such electric-field-induced phase transition expands or contracts lattices to produce a phase transition strain. A substance that can undergo electric-field-induced phase transition is an antiferroelectric substance. Thus, in an antiferroelectric substance, some adjacent dipoles oriented in antiparallel directions in the absence of an electric field are inverted such that the dipoles are oriented unidirectionally upon the application of an electric field. In a P-V curve showing the amount of polarization P of an antiferroelectric substance as a function of voltage V, the antiferroelectric substance has double hysteresis loops in the positive electric field direction and the negative electric field direction. In regions where the amount of polarization changes drastically, phase transition occurs from a ferroelectric phase to an antiferroelectric phase and from an antiferroelectric phase to a ferroelectric phase.

Unlike the antiferroelectric substance, a ferroelectric substance does not have a double hysteresis in a P-V curve. In the ferroelectric substance, spontaneous polarization occurs unidirectionally, and piezoelectric strain increases linearly with voltage applied. Thus, the ferroelectric substance facilitates the control of piezoelectric strain and the control of droplet size, and a single piezoelectric element can produce both a small amplitude vibration (microvibration) and a large amplitude vibration, which produces a large excluded volume.

Preferably, the piezoelectric layer 70 has an X-ray powder diffraction pattern that includes both a diffraction peak assigned to a ferroelectric phase and a diffraction peak assigned to an antiferroelectric phase. The piezoelectric layer 70 that includes both a diffraction peak assigned to a ferroelectric phase and a diffraction peak assigned to an antiferroelectric phase, that is, includes a morphotropic phase boundary (MPB) between the antiferroelectric phase and the ferroelectric phase provides a piezoelectric element that can produce a large strain. In the piezoelectric layer 70, x is preferably in the range of $0.17 \leq x \leq 0.20$, more preferably $0.19 \leq x \leq 0.20$, in the general formula (1). In these ranges, as shown in the examples described below, the X-ray powder diffraction pattern includes both a diffraction peak assigned to a ferroelectric phase and a diffraction peak assigned to an antiferroelectric phase, indicating the coexistence of the antiferroelectric phase and the ferroelectric phase. The MPB between the antiferroelectric phase and the ferroelectric phase provides a piezoelectric element that can produce a large strain.

Each of the second electrodes 80, which are the individual electrodes of the piezoelectric elements 300, is connected to one of lead electrodes 90. Each of the lead electrodes 90 may be formed of gold (Au) and extends from the neighborhood of an end of the ink feed channel 14 to the insulator film 55.

The flow-passage-forming substrate 10 on which the piezoelectric elements 300 are disposed is covered with a protective substrate 30 with an adhesive 35 interposed therebetween. In other words, the first electrode 60, the insulator film 55, and the lead electrode 90 are covered with the protective substrate 30. The protective substrate 30 includes a reservoir portion 31, which constitutes at least part of a reservoir 100. The reservoir portion 31 is disposed in the protective substrate 30 in the thickness direction and extends in the width direction of the pressure-generating chambers 12. As described above, the reservoir portion 31 communicates with the communication portion 13 in the flow-passage-forming substrate 10, constituting the reservoir 100. The reservoir 100 serves as a common ink chamber for the pressure-generating chambers 12. The communication portion 13 in the flow-passage-forming substrate 10 may be divided so as to correspond to each of the pressure-generating chambers 12, and only the reservoir portion 31 may function as a reservoir. Furthermore, for example, the flow-passage-forming substrate 10 may only include the pressure-generating chambers 12, and components between the flow-passage-forming substrate 10 and the protective substrate 30 (such as the elastic film 50 and the insulator film 55) may include ink feed channels 14 connecting the reservoir with the pressure-generating chambers 12.

The protective substrate 30 includes a piezoelectric element housing space 32 opposite to the piezoelectric elements 300. The piezoelectric element housing space 32 does not interfere with the displacement of the piezoelectric elements 300. After ensuring that the walls of the piezoelectric element housing space 32 do not interfere with the displacement of the piezoelectric elements 300, the space may be sealed or not.

The protective substrate 30 is preferably formed of a material having substantially the same thermal expansion coefficient as the flow-passage-forming substrate 10, for example, glass or ceramic material. In the present embodiment, the protective substrate 30 is formed of a silicon single crystal, which is the same material as the flow-passage-forming substrate 10.

The protective substrate 30 includes a through-hole 33 passing through the protective substrate 30 in the thickness direction. The neighborhoods of the ends of the lead electrodes 90 extending from the piezoelectric elements 300 are exposed in the through-hole 33.

A drive circuit 120 for driving the piezoelectric elements 300 is fixed onto the protective substrate 30. The drive circuit 120 is juxtaposed to the piezoelectric elements 300. The drive circuit 120 may be a circuit board or a semiconductor integrated circuit (IC). The drive circuit 120 is electrically connected to the lead electrodes 90 through interconnecting wiring. The interconnecting wiring includes electroconductive wires, such as bonding wires.

The protective substrate 30 is attached to a compliance substrate 40. The compliance substrate 40 includes a sealing film 41 and a fixing sheet 42. The sealing film 41 is formed of a flexible material and seals one side of the reservoir portion 31. The fixing sheet 42 is formed of a relatively hard material. The fixing sheet 42 has an opening 43 on top of the reservoir 100. Thus, one side of the reservoir 100 is sealed with the flexible sealing film 41 alone.

In the ink jet print head I according to the present embodiment, the reservoir 100 to the nozzle openings 21 are filled with ink supplied from an ink inlet connected to an external ink supply unit (not shown). A voltage is applied between the first electrode 60 and the second electrode 80 disposed on the corresponding pressure-generating chamber 12 in response to a print signal from the drive circuit 120 to deform the elastic film 50, the insulator film 55, the first electrode 60, and the piezoelectric layer 70. The deformation increases the internal pressure of the pressure-generating chamber 12, allowing ink droplets to be ejected from the corresponding nozzle opening 21.

A method for manufacturing an ink jet print head according to the present embodiment will be described below with reference to FIGS. 19A to 23B. FIGS. 19A to 23B are longitudinal cross-sectional views of a pressure-generating chamber.

Figure 19A:
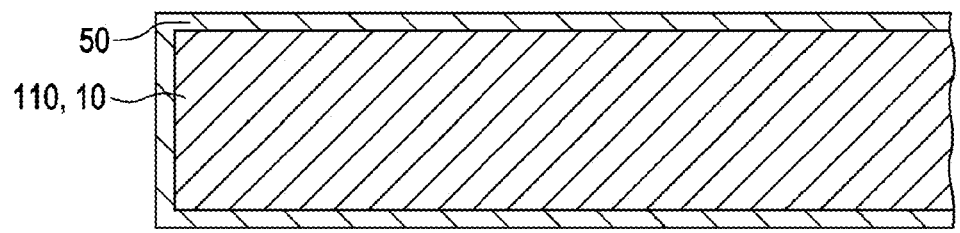
FIG. 19A is a cross-sectional view illustrating a process of manufacturing the print head according to the first embodiment.
Figure 19B:
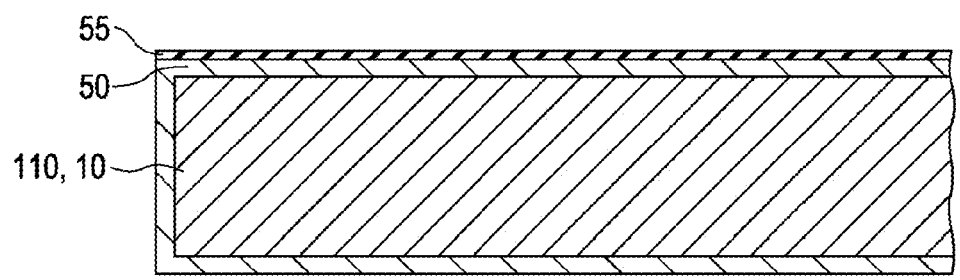
FIG. 19B is a cross-sectional view illustrating a process of manufacturing the print head according to the first embodiment.

As illustrated in FIG. 19A, the surface of a flow-passage-forming substrate wafer 110 formed of silicon may be thermally oxidized to form a silicon dioxide ($SiO_2$) elastic film 50. As illustrated in FIG. 19B, an insulator film 55, for example, formed of zirconium oxide is then formed on the elastic film 50 (silicon dioxide film), for example, by reactive sputtering or thermal oxidation.

Figure 20A:
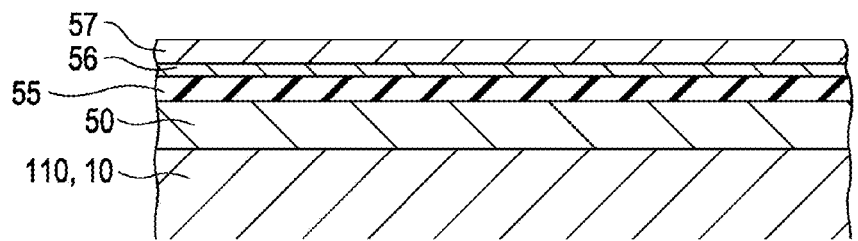
FIG. 20A is a cross-sectional view illustrating a process of manufacturing the print head according to the first embodiment.

As illustrated in FIG. 20A, a titanium film 56 is then formed on the insulator film 55, for example, by DC sputtering or ion sputtering. A platinum film 57 is then formed over the entire surface of the titanium film 56, for example, by DC sputtering. The platinum film 57 is then patterned.

Figure 20B:
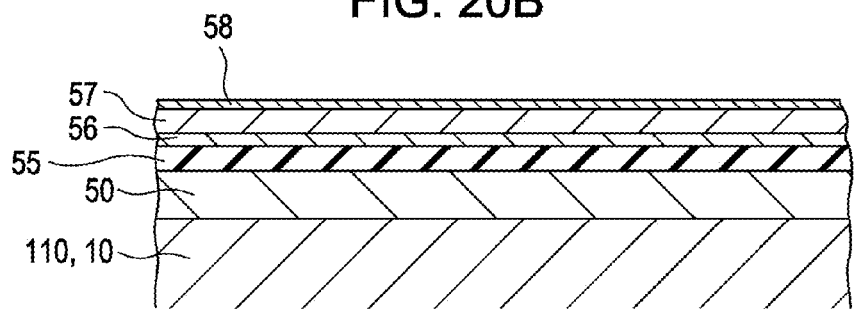
FIG. 20B is a cross-sectional view illustrating a process of manufacturing the print head according to the first embodiment.

As illustrated in FIG. 20B, a STO precursor film 58 is then formed on the platinum film 57. The STO precursor film 58 may be formed by any method, for example, a sputtering method, a laser ablation method, a metal-organic chemical vapor deposition (MOCVD) method, a metal-organic decomposition (MOD) method, or a sol-gel method. In the present embodiment, the STO precursor film 58 is formed by the sol-gel method. More specifically, a Nb-STO sol-gel solution is applied to the platinum film 57 and is dried and degreased to form the STO precursor film 58.

A piezoelectric layer 70 is then formed on the STO precursor film 58. The piezoelectric layer 70 may be formed by any method, including a metal-organic decomposition (MOD) method. In the MOD method, an organometallic compound dissolved or dispersed in a solvent is applied, is dried, and is fired at a high temperature to form the piezoelectric layer 70 formed of a metal oxide. The piezoelectric layer 70 may also be formed by a liquid phase method or a solid phase method, such as a sol-gel method, a laser ablation method, a sputtering method, a pulsed laser deposition (PLD) method, a chemical vapor deposition (CVD) method, or an aerosol deposition method.

Figure 20C:
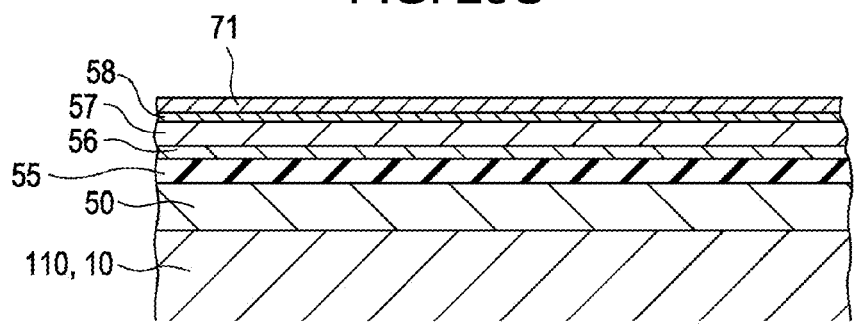
FIG. 20C is a cross-sectional view illustrating a process of manufacturing the print head according to the first embodiment.

As illustrated in FIG. 20C, in specific procedures for forming the piezoelectric layer 70, a sol or an MOD solution (a precursor solution) that contains an organometallic compound, more specifically, an organometallic compound containing bismuth, lanthanum, iron, and manganese at a predetermined ratio is applied to the STO precursor film 58, for example, by a spin coating method to form a piezoelectric precursor film 71 (a coating step).

The precursor solution is prepared by mixing organometallic compounds containing bismuth, lanthanum, iron, or manganese such that the metals are contained at a desired molar ratio, and dissolving or dispersing the mixture in an organic solvent, such as an alcohol. Examples of the organometallic compounds containing bismuth, lanthanum, iron, or manganese include metal alkoxides, organic acid salts, and β-diketone complexes. An exemplary organometallic compound containing bismuth is bismuth 2-ethylhexanoate. An exemplary organometallic compound containing lanthanum is lanthanum 2-ethylhexanoate. An exemplary organometallic compound containing iron is iron 2-ethylhexanoate. An exemplary organometallic compound containing manganese is manganese 2-ethylhexanoate.

The piezoelectric precursor film 71 is then heated at a predetermined temperature for a predetermined period of time for drying (a drying step). The piezoelectric precursor film 71 thus dried is then heated at a predetermined temperature for a predetermined period of time for degreasing (a degreasing step). The term "degreasing", as used herein, means that organic components contained in the piezoelectric precursor film 71 are removed as NO2, CO2, and/or H2O, for example. The drying step and the degreasing step may be performed in any atmosphere, such as in the air or in an inert gas.

Figure 20D:
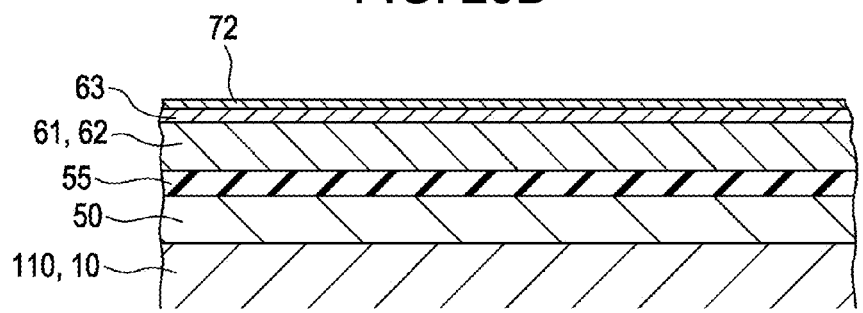
FIG. 20D is a cross-sectional view illustrating a process of manufacturing the print head according to the first embodiment.

As illustrated in FIG. 20D, the piezoelectric precursor film 71 is crystallized in an inert gas atmosphere at a predetermined temperature, for example, in the range of approximately 600° C. to 700° C. for a predetermined period of time to form a piezoelectric film 72 (a firing step). At the same time, the STO precursor film 58 is also fired to form a STO layer 63. In other words, the STO precursor film 58 is not crystallized alone but crystallized simultaneously with the piezoelectric precursor film 71.

Examples of a heater used in the drying step, the degreasing step, and the firing step include rapid thermal annealing (RTA) apparatuses and hot plates. RTA involves heating by infrared lamp irradiation.

Figure 21A:
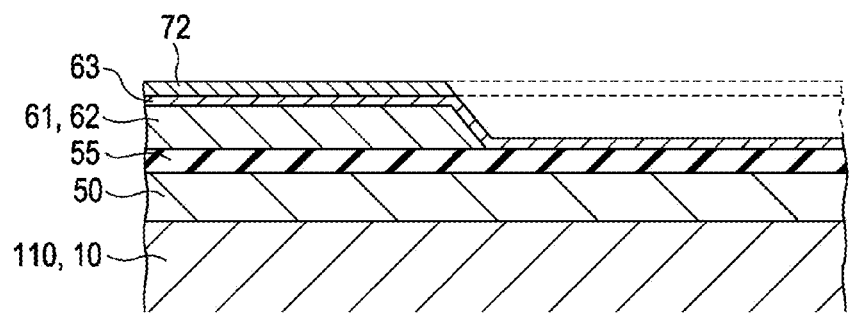
FIG. 21A is a cross-sectional view illustrating a process of manufacturing the print head according to the first embodiment.

As illustrated in FIG. 21A, the first electrode 60 and the (first) piezoelectric film 72 are simultaneously etched so as to have an inclined side surface, using a resist mask (not shown) having a predetermined shape disposed on the piezoelectric film 72.

Figure 21B:
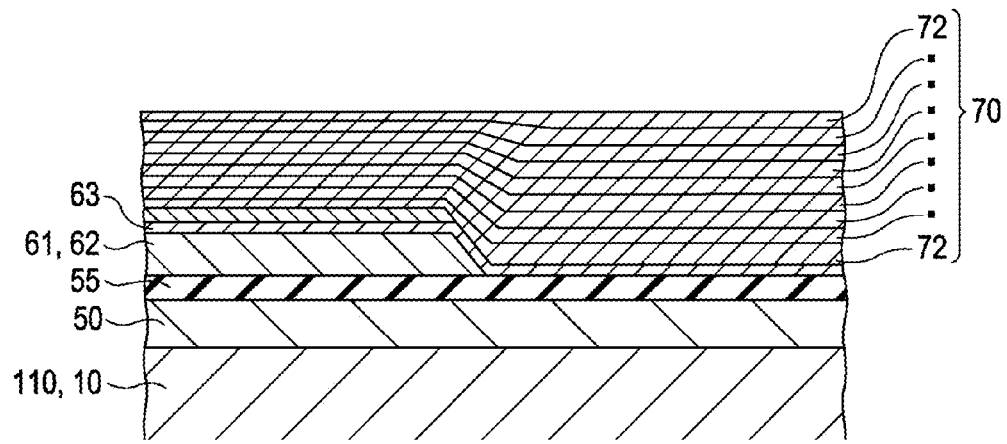
FIG. 21B is a cross-sectional view illustrating a process of manufacturing the print head according to the first embodiment.

Depending on the desired film thickness of the piezoelectric layer 70, after the resist is removed, the coating step, the drying step, the degreasing step, and optionally the firing step may be performed more than once to form the piezoelectric layer 70 composed of a plurality of piezoelectric films 72, as illustrated in FIG. 21B. If the thickness of the piezoelectric film 72 formed by a single application of the coating solution is approximately 0.1 µm, the piezoelectric layer 70 composed of 10 piezoelectric films 72 would have a thickness of approximately 1 µm. Although the piezoelectric film 72 has a layered structure in the present embodiment, the piezoelectric film 72 may be a monolayer.

In the crystallization of the piezoelectric precursor film 71, depending on the firing conditions or other conditions, the platinum film 57 becomes a platinum layer 62, which may contain titanium or titanium oxide depending on the degree of diffusion of titanium. In the present embodiment, the diffusion of titanium forms a titanium oxide layer between the platinum layer 62 and the STO layer 63. However, the titanium oxide layer does not affect the crystalline orientation of the piezoelectric layer 70.

The inert gas atmosphere may be the atmosphere of a noble gas, such as helium or argon, an inert gas, such as nitrogen, or a mixture thereof. The inert gas may substitute for the atmosphere in the heater or may flow through the heater. The inert gas concentration may be less than 100% provided that titanium in the titanium film 56 disposed on the platinum film 57 (the first electrode 60) adjacent to the flow-passage-forming substrate 10 can diffuse. For example, the inert gas atmosphere may contain less than 20% oxygen.

Figure 22A:
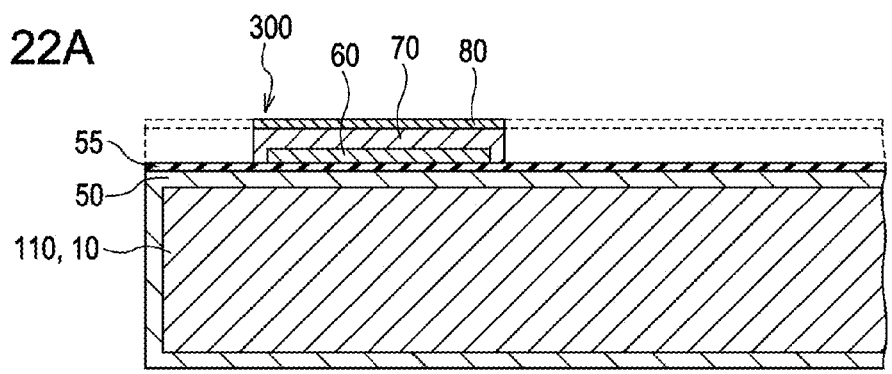
FIG. 22A is a cross-sectional view illustrating a process of manufacturing the print head according to the first embodiment.

After the piezoelectric layer 70 is formed, a second electrode 80, for example, formed of platinum is formed on the piezoelectric layer 70 by sputtering, as illustrated in FIG. 22A. The piezoelectric layers 70 and the second electrodes 80 are simultaneously patterned so as to correspond to the pressure-generating chambers 12. The first electrode 60, the piezoelectric layer 70, and the second electrode 80 constitute a piezoelectric element 300. The piezoelectric layers 70 and the second electrodes 80 may be simultaneously dry-etched using a resist mask (not shown) having a predetermined shape. If necessary, post-annealing may be performed at a temperature in the range of 600° C. to 700° C. Post-annealing can provide a good interface between the piezoelectric layer 70 and the first electrode 60 or the second electrode 80 and improve the crystallinity of the piezoelectric layer 70.

Figure 22B:
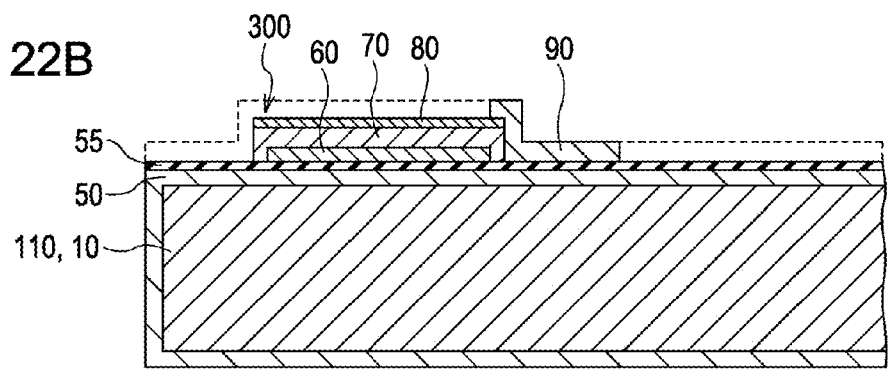
FIG. 22B is a cross-sectional view illustrating a process of manufacturing the print head according to the first embodiment.

As illustrated in FIG. 22B, a lead electrode, for example, formed of gold (Au) is formed over the entire surface of the flow-passage-forming substrate wafer 110. Lead electrodes 90 corresponding to the piezoelectric elements 300 are patterned, for example, using a resist mask (not shown).

Figure 22C:
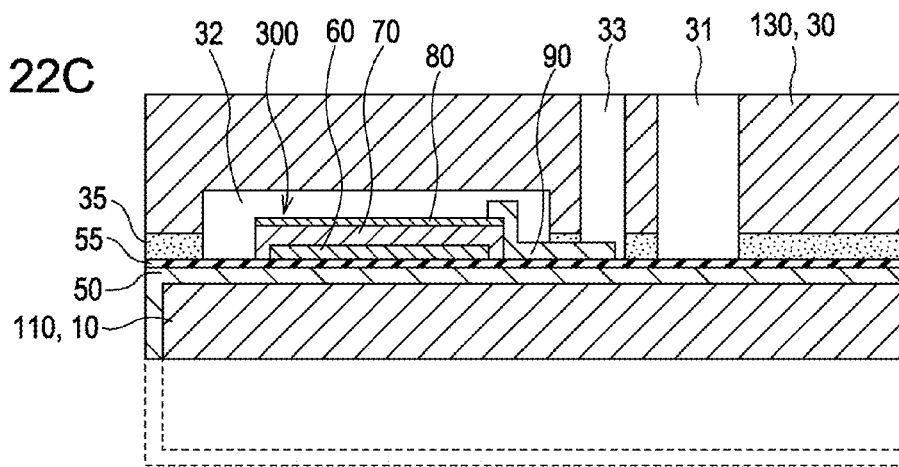
FIG. 22C is a cross-sectional view illustrating a process of manufacturing the print head according to the first embodiment.

As illustrated in FIG. 22C, the piezoelectric elements 300 on the flow-passage-forming substrate wafer 110 are then covered with a protective substrate wafer 130 with an adhesive 35 interposed therebetween. The protective substrate wafer 130 is a silicon wafer and is to become a plurality of protective substrates 30. The thickness of the flow-passage-forming substrate wafer 110 is then reduced to a predetermined thickness.

Figure 23A:
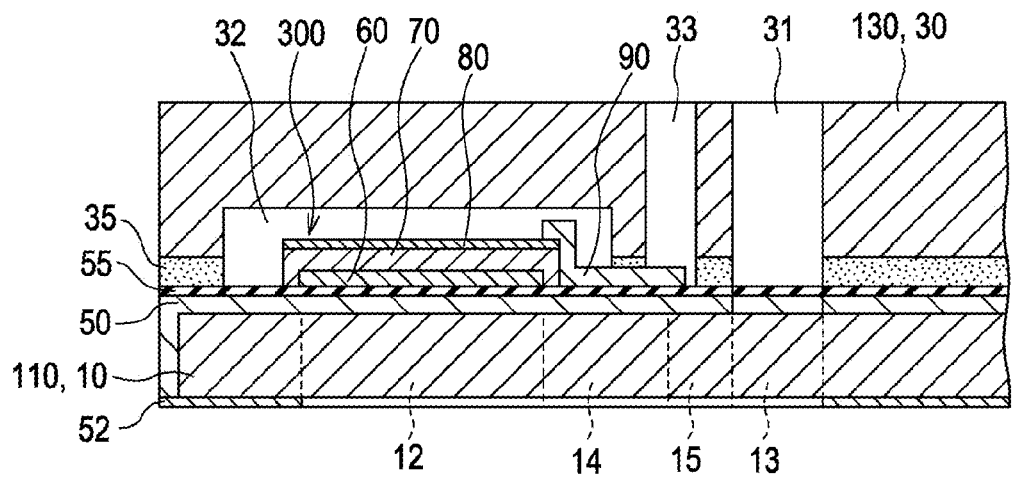
FIG. 23A is a cross-sectional view illustrating a process of manufacturing the print head according to the first embodiment.

As illustrated in FIG. 23A, a mask film 52 is then formed on the flow-passage-forming substrate wafer 110 and is patterned in a predetermined shape.

Figure 23B:
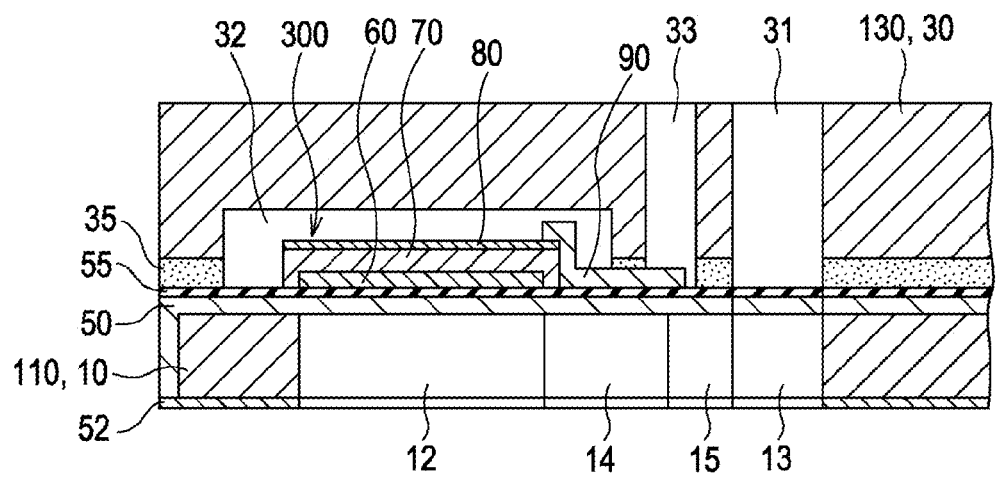
FIG. 23B is a cross-sectional view illustrating a process of manufacturing the print head according to the first embodiment.

As illustrated in FIG. 23B, the flow-passage-forming substrate wafer 110 is then subjected to anisotropic etching (wet etching) with an alkaline solution, such as KOH, through the mask film 52 to form pressure-generating chambers 12 corresponding to the piezoelectric elements 300, a communication portion 13, ink feed channels 14, and communication paths 15.

Subsequently, unnecessary portions on the peripheries of the flow-passage-forming substrate wafer 110 and protective substrate wafer 130 are removed, for example, by cutting, such as dicing. After the mask film 52 on the flow-passage-forming substrate wafer 110 is removed, a nozzle plate 20 having nozzle openings 21 is attached to the flow-passage-forming substrate wafer 110. A compliance substrate 40 is attached to the protective substrate wafer 130. The flow-passage-forming substrate wafer 110 is then divided into flow-passage-forming substrates 10 of a chip size as illustrated in FIG. 1, thus fabricating an ink jet print head I according to the present embodiment.

Another Manufacturing Process

A piezoelectric layer containing crystals preferentially oriented in the (111) plane may be formed by another process.

The orientation control layer on the platinum film may be a strontium ruthenate (SRO) layer in place of the STO layer. The piezoelectric precursor film containing bismuth, lanthanum, iron, and manganese disposed on the orientation control layer may be fired in an inert gas atmosphere or in the air or an oxygen atmosphere for crystallization provided that the piezoelectric layer contains crystals preferentially oriented in the (111) plane.

The SRO layer may be formed by any method, for example, a sputtering method, a laser ablation method, a MOCVD method, a sol-gel method, or a MOD method.

Second Embodiment

In the first embodiment, the first electrode 60 includes the STO layer or the SRO layer as the orientation control layer on the platinum layer 62 so that the piezoelectric layer containing bismuth lanthanum iron-manganese oxide contains crystals preferentially oriented in the (111) plane. In the present embodiment, the first electrode 60 includes a platinum layer containing platinum disposed on an iridium oxide layer containing iridium oxide. The components of an ink jet print head according to the present embodiment other than the first electrode 60 are the same as in the first embodiment and will not be further described.

In the present embodiment, the first electrode 60 includes an iridium oxide layer containing iridium oxide having a thickness in the range of 30 to 80 nm and a platinum layer containing platinum having a thickness in the range of 50 to 200 nm, layered in this order on the elastic film 50. The piezoelectric layer 70 is disposed on the platinum layer.

The platinum layer disposed on the iridium oxide layer in the first electrode 60 allows the crystals of the piezoelectric layer 70 containing bismuth lanthanum iron-manganese oxide to be preferentially oriented in the (111) plane without the orientation control layer formed in the first embodiment.

In the present embodiment, the platinum layer is formed of platinum having a half-width of the (111) plane of 10 degrees or less. The platinum layer formed of platinum having a half-width of the (111) plane of 10 degrees or less allows the crystals of the piezoelectric layer 70 to be more preferentially oriented in the (111) plane than the orientation control layer formed in the first embodiment. The term "half-width", as used herein, refers to a width at half of the peak intensity of a specific crystal face in a rocking curve in an X-ray diffraction chart.

A method for manufacturing an ink jet print head according to the present embodiment is the same as in the first embodiment except the process of forming the first electrode 60 and the atmosphere in the firing step of the piezoelectric layer 70 and will not be further described.

An elastic film 50 and an insulator film 55 are formed on a flow-passage-forming substrate wafer 110 in the same manner as in the first embodiment. An iridium oxide film formed of iridium oxide is formed over the entire surface of the insulator film 55, for example, by DC sputtering. A platinum film formed of platinum is then formed over the entire surface of the iridium oxide film, for example, by DC sputtering. A TiAlN layer or an Ir layer may be formed as a base layer of the iridium oxide film, for example, by DC sputtering.

The piezoelectric layer 70 is then formed on the platinum film in the same manner as in the first embodiment. Unlike the first embodiment, the piezoelectric precursor film 71 must be fired for crystallization in an inert gas atmosphere in the present embodiment. Firing not in an inert gas atmosphere but in an oxygen atmosphere cannot form the piezoelectric layer 70 containing crystals preferentially oriented in the (111) plane, as described below in the comparative example. The inert gas atmosphere may be the atmosphere of a noble gas, such as helium or argon, an inert gas, such as nitrogen, or a mixture thereof. The inert gas may substitute for the atmosphere in the heater or may flow through the heater. The inert gas concentration may be less than 100%. For example, the inert gas atmosphere may contain less than 20% oxygen.

After the piezoelectric layer 70 is formed, an ink jet print head I according to the present embodiment can be fabricated in the same manner as in the first embodiment.

EXAMPLES

The invention will be further described in the following examples. However, the invention is not limited to these examples.

Example 1

A surface of a silicon substrate was thermally oxidized to form a silicon dioxide film. A zirconium oxide film having a thickness of 400 nm was then formed on the silicon dioxide film by RF sputtering. A titanium film having a thickness of 20 nm was then formed on the zirconium oxide film by DC sputtering. A platinum film having a thickness of 130 nm was then formed on the titanium film by DC sputtering. A Nb-STO sol-gel solution was then applied to the platinum film by spin coating at 500 rpm and subsequently 3000 rpm for 30 seconds, was dried at 300° C. for three minutes, and was degreased to form a STO precursor film.

A piezoelectric layer was then formed on the STO precursor film by spin coating in the following manner. First, solutions of bismuth 2-ethylhexanoate, lanthanum 2-ethylhexanoate, iron 2-ethylhexanoate, or manganese 2-ethylhexanoate in xylene and octane were mixed at a predetermined ratio to prepare a precursor solution. The precursor solution was dropped onto the substrate on which the STO precursor film was disposed. The substrate was initially rotated at 500 rpm for five seconds and subsequently 1500 rpm for 30 seconds to form a piezoelectric precursor film (a coating step). Drying and degreasing were then performed in the air at 350° C. for three minutes (a drying and degreasing step). After the coating step and the drying and degreasing step were performed twice, firing was performed by rapid thermal annealing (RTA) at 650° C. for two minutes while nitrogen flowed through a heater at a flow rate of 500 cc/min (a firing step). The two cycles of the coating step and the drying and degreasing step and the single firing step were performed three times (six coating steps in total). Firing by RTA at 650° C. for five minutes while nitrogen flowed through the heater at a flow rate of 500 cc/min yielded a piezoelectric layer having a thickness of 450 nm. In the first firing step, the STO precursor film was also fired to form a STO layer.

A platinum film having a thickness of 100 nm was formed as a second electrode on the piezoelectric layer by DC sputtering. Firing by RTA at 650° C. for five minutes while nitrogen flowed through the heater at a flow rate of 500 cc/min yielded a piezoelectric element. The piezoelectric element included a piezoelectric layer formed of a complex oxide containing titanium. The piezoelectric element basically had an $ABO_3$ structure expressed by the general formula (1) in which $x=0.19$ and $y=0.03$.

Example 2

A piezoelectric element was formed in the same manner as in Example 1 except that, in place of the STO layer, a strontium ruthenate (SRO) layer having a (100) preferred orientation and a thickness of 50 nm was formed on the platinum film by sputtering.

Comparative Example 1

The procedures described in Example 1 were performed except that the STO layer was not formed.

Comparative Example 2

The procedures described in Example 1 were performed except that a piezoelectric layer was formed by forming a titanium oxide film in place of the titanium film on the zirconium oxide film, forming a platinum film on the titanium oxide film, and forming no STO layer on the titanium oxide film.

Text Example 1

Figure 24:
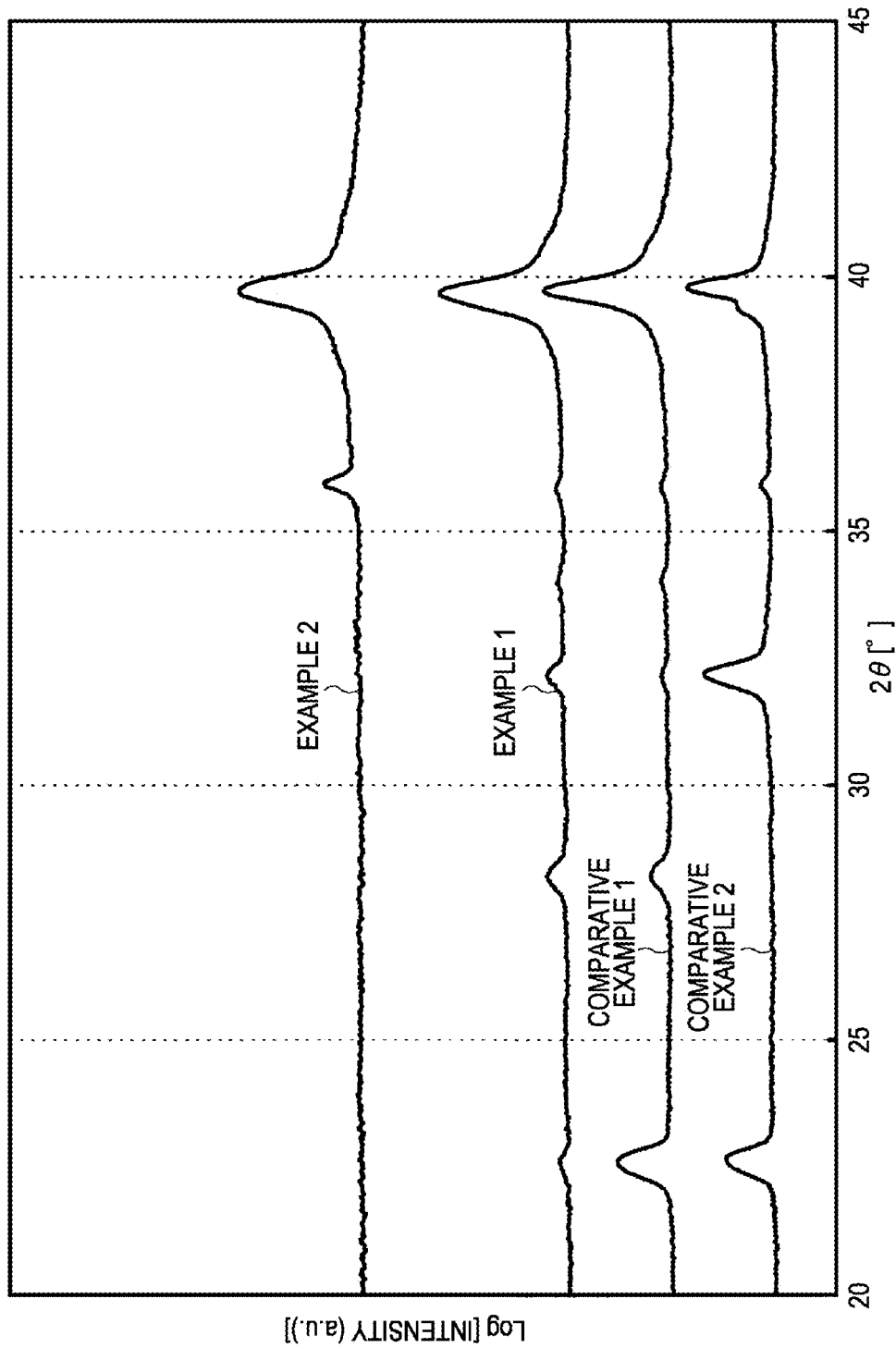
FIG. 24 is a graph showing X-ray diffraction patterns of Examples 1 and 2 and Comparative Examples 1 and 2.
Figure 25:
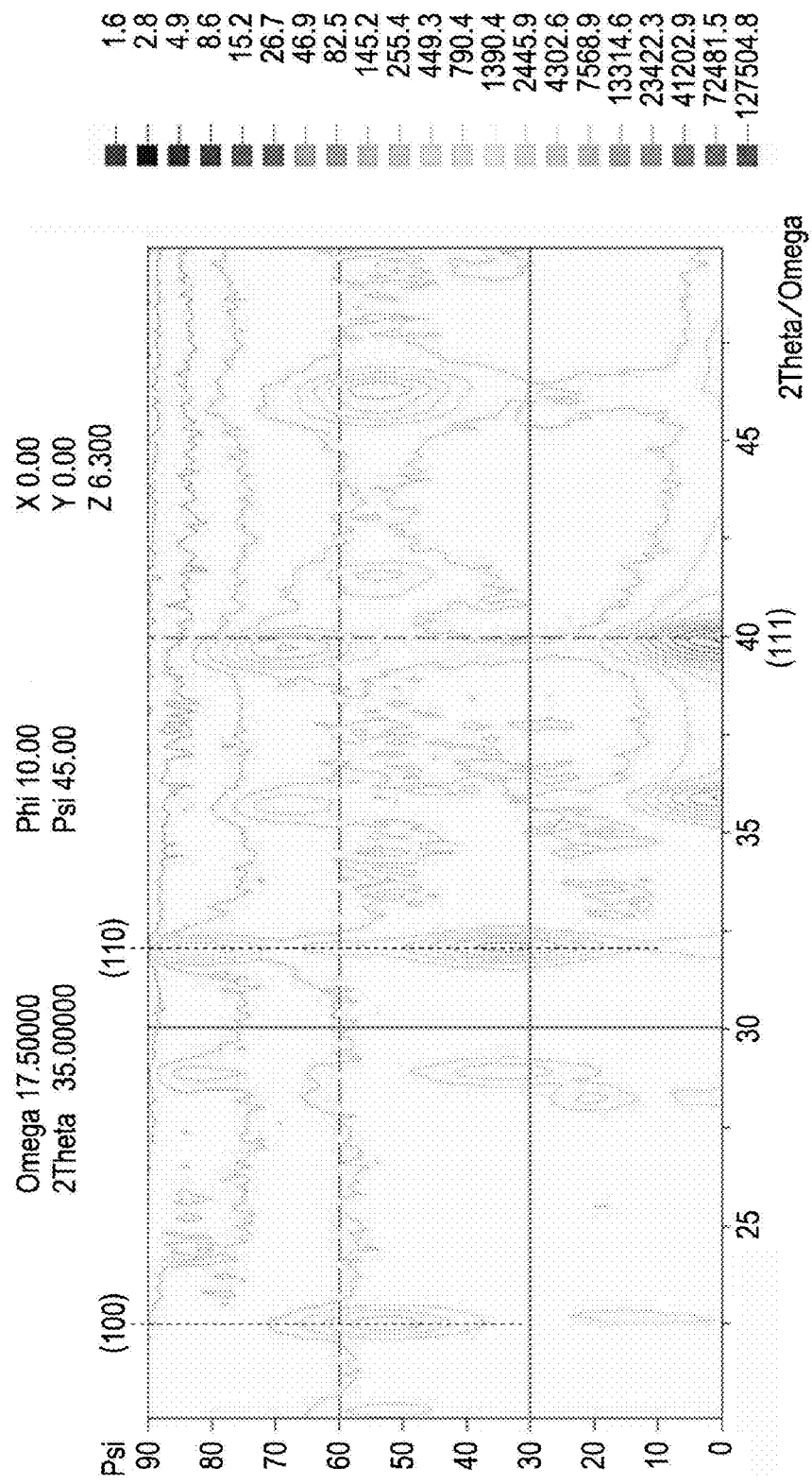
FIG. 25 is a reciprocal lattice map of Example 1.

The X-ray powder diffraction patterns of the piezoelectric layers of the piezoelectric elements according to Examples 1 and 2 and Comparative Examples 1 and 2 were measured at room temperature and φ=φ=0° with an X-ray diffractometer "D8 Discover" manufactured by Bruker AXS using a CuKα line as an X-ray source. FIG. 24 shows the X-ray diffraction patterns of Examples 1 and 2 and Comparative Examples 1 and 2 showing the relationship between the diffraction intensity and the diffraction angle 2θ. FIG. 25 is a reciprocal lattice map of Example 1.

As shown in FIG. 24, the X-ray diffraction (XRD) pattern depends on the RTA atmosphere, the material of the base of the platinum film serving as the first electrode, and whether the first electrode is formed of platinum or another material. It is presumed that Comparative Examples 1 and 2 had a random orientation and Examples 1 and 2 had a preferred orientation in the (111) plane rather than a (100) plane. A peak derived from the (111) orientation does not clearly prove the (111) preferred orientation because of overlap with a platinum peak at 2θ of approximately 40°. In accordance with the reciprocal lattice mapping in which 2θ was measured during rotation in a φ direction, the piezoelectric layer of Example 1 had a (110) peak at a φ of approximately 30°, clearly indicating the presence of the (111) peak at φ=0°. Diffraction peaks derived from $ABO_3$ were observed in Examples 1 and 2 and Comparative Examples 1 and 2, indicating that the piezoelectric layers of Examples 1 and 2 and Comparative Examples 1 and 2 had an $ABO_3$ structure.

Example 3

A surface of a single crystal silicon substrate was thermally oxidized to form a silicon dioxide film. A titanium aluminum nitride film having a thickness of 50 nm, an iridium film having a thickness of 100 nm, an iridium oxide film having a thickness of 30 nm, and a platinum film having a thickness of 150 nm were sequentially formed on the silicon dioxide film by DC magnetron sputtering.

A piezoelectric layer was then formed on the platinum film by spin coating in the following manner. First, a solution of bismuth 2-ethylhexanoate in octane, a solution of manganese 2-ethylhexanoate in octane, a solution of iron 2-ethylhexanoate in xylene, and a solution of lanthanum 2-ethylhexanoate in xylene, amyl alcohol, and diethanolamine (xylene: amyl alcohol:diethanolamine=70:25:5 (weight ratio)) were mixed at a predetermined ratio to prepare a precursor solution. The precursor solution was dropped onto the substrate on which the platinum film was disposed. The substrate was initially rotated at 500 rpm for five seconds and subsequently 1500 rpm for 30 seconds to form a piezoelectric precursor film (a coating step). Drying and degreasing were then performed in the air at 350° C. for three minutes (a drying and degreasing step). After the coating step and the drying and degreasing step were performed twice, firing was performed by rapid thermal annealing (RTA) at 650° C. for two minutes while nitrogen flowed through a heater at a flow rate of 5 L/min (a firing step). The two cycles of the coating step and the drying and degreasing step and the single firing step were performed three times (six coating steps in total). Firing by RTA at 650° C. for five minutes while nitrogen flowed through the heater at a flow rate of 5 L/min yielded a piezoelectric layer having a thickness of 450 nm.

A platinum film having a thickness of 100 nm was formed as a second electrode on the piezoelectric layer by DC sputtering. Firing by RTA at 650° C. for five minutes while nitrogen flowed through the heater at a flow rate of 5 L/min yielded a piezoelectric element. The piezoelectric element included a piezoelectric layer formed of a complex oxide having an $ABO_3$ structure expressed by the general formula (1) in which x=0.19 and y=0.03.

Comparative Example 3

The procedures described in Example 3 were performed except that RTA was performed while oxygen flowed through a heater at a flow rate of 5 L/min.

Text Example 2

Figure 26:
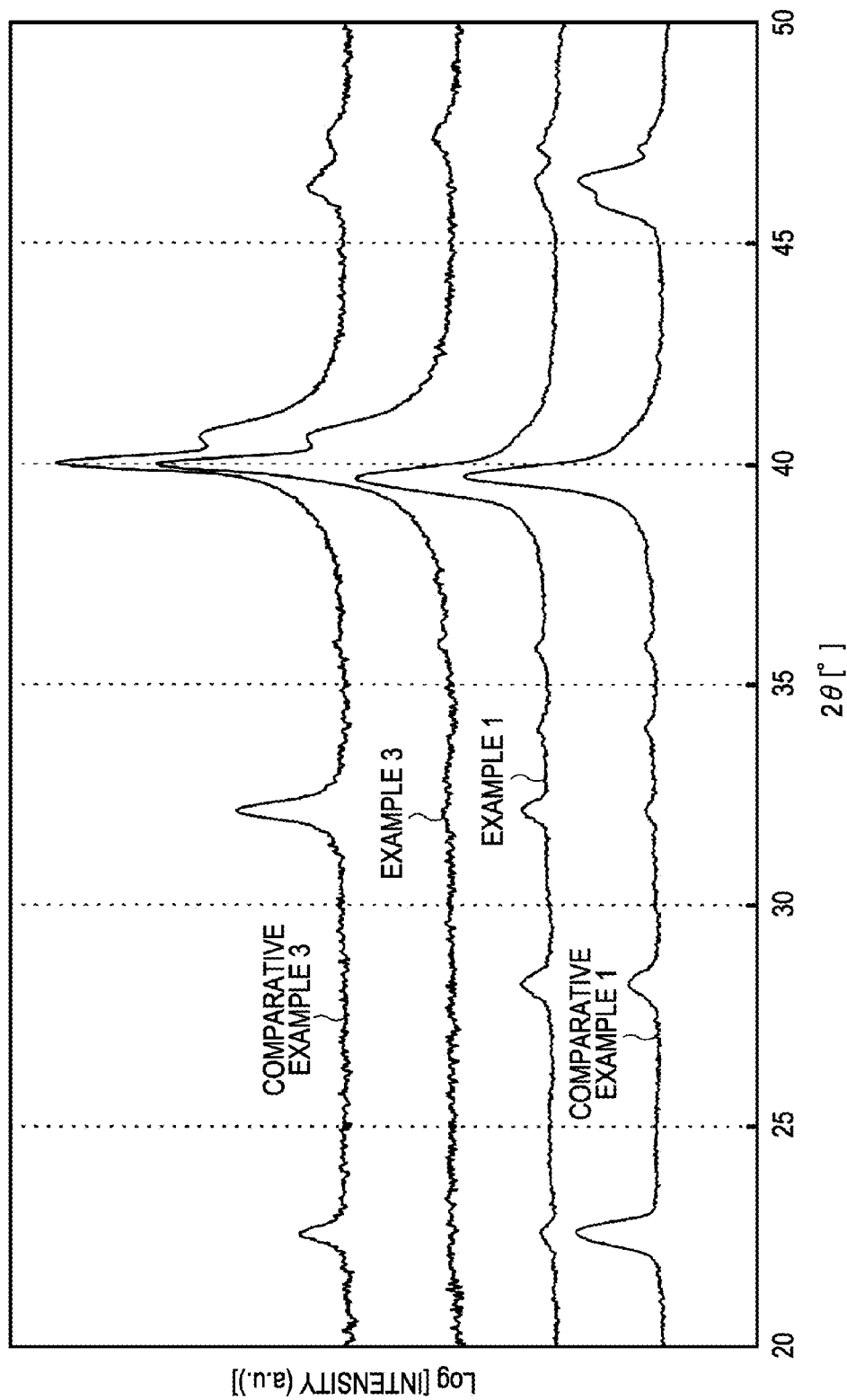
FIG. 26 is a graph showing X-ray diffraction patterns of Examples 1 and 3 and Comparative Examples 1 and 3.
Figure 27:
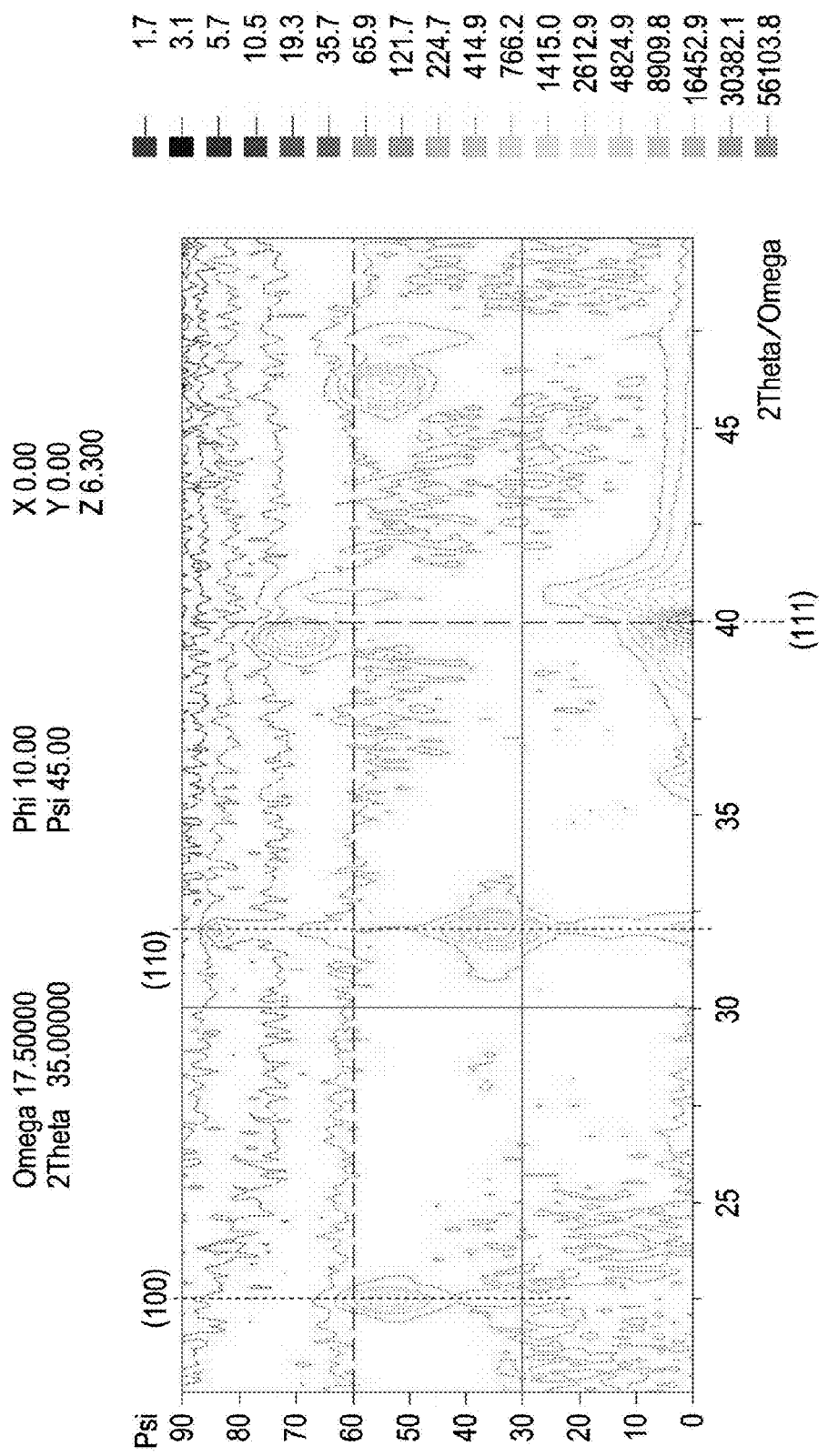
FIG. 27 is a reciprocal lattice map of Example 3.

The X-ray powder diffraction patterns of the piezoelectric layers of the piezoelectric elements according to Example 3 and Comparative Example 3 were measured at room temperature and φ=φ=0° with an X-ray diffractometer "D8 Discover" manufactured by Bruker AXS using a CuKα line as an X-ray source. FIG. 26 shows the X-ray diffraction patterns of Example 3 and Comparative Example 3, together with the X-ray diffraction patterns of Example 1 and Comparative Example 1, showing the relationship between the diffraction intensity and the diffraction angle 2θ. FIG. 27 is a reciprocal lattice map of Example 3.

As shown in FIG. 26, the piezoelectric layer of Example 3, in which the iridium oxide layer and the platinum layer were stacked and the piezoelectric layer was fired in the inert gas atmosphere, contained crystals preferentially oriented in the (111) plane. Comparative Example 3, in which the piezoelectric layer was fired in the oxygen atmosphere, contained randomly oriented crystals. A peak derived from the (111) orientation does not clearly prove the (111) preferred orientation because of overlap with a platinum peak at 2θ of approximately 40°. In accordance with the reciprocal lattice mapping (FIG. 27) in which 2θ was measured during rotation in a φ direction, the piezoelectric layer of Example 3 had a peak derived from the (110) plane at a φ of approximately 30°, clearly indicating the presence of a peak derived from the (111) plane at φ=0°.

A comparison of Example 1 with Example 3 shows that although both of the piezoelectric layers contain crystals preferentially oriented in the (111) plane, orientations in the (100) plane and the (110) plane can be observed in Example 1, but these orientations are not observed in Example 3. The half-width of the peak derived from the (111) plane of the piezoelectric layer is smaller in Example 3 than in Example 1. This indicates that the piezoelectric layer of Example 3 is more preferentially oriented in the (111) plane than the piezoelectric layer of Example 1.

Diffraction peaks derived from $ABO_3$ were observed in Example 3 and Comparative Example 3, indicating that the piezoelectric layers of Example 3 and Comparative Example 3 had an $ABO_3$ structure.

Text Example 3

Figure 28:
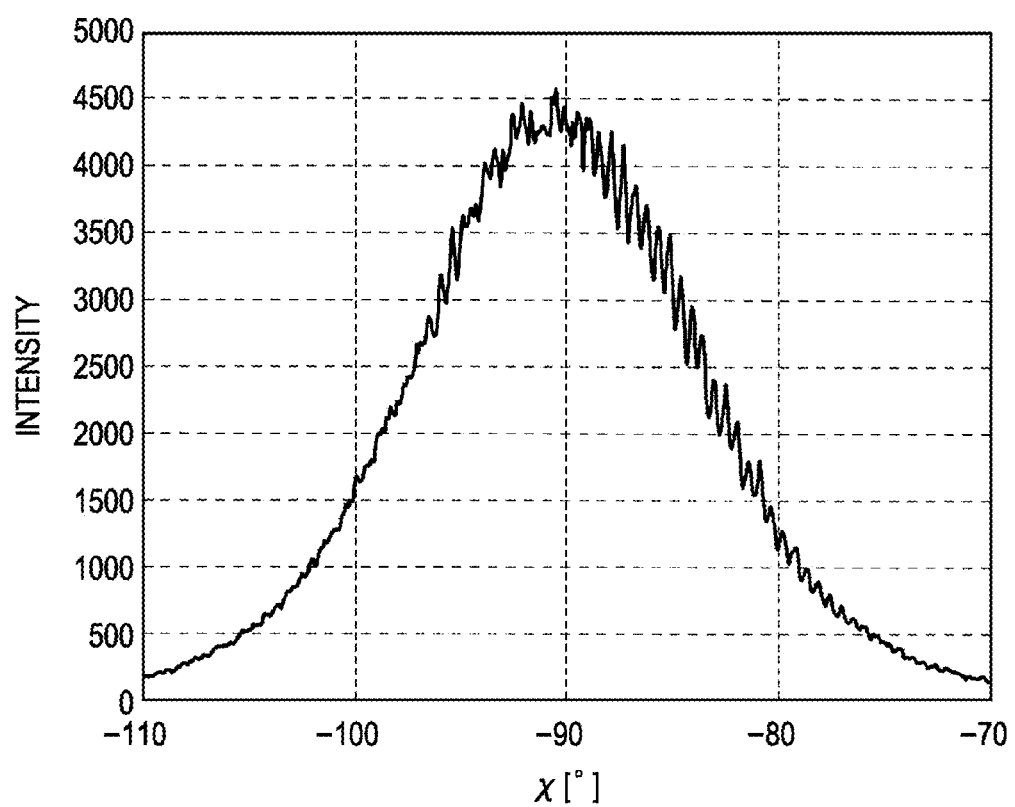
FIG. 28 is a graph showing the x scan of the (111) plane of a platinum layer in Example 1.
Figure 29:
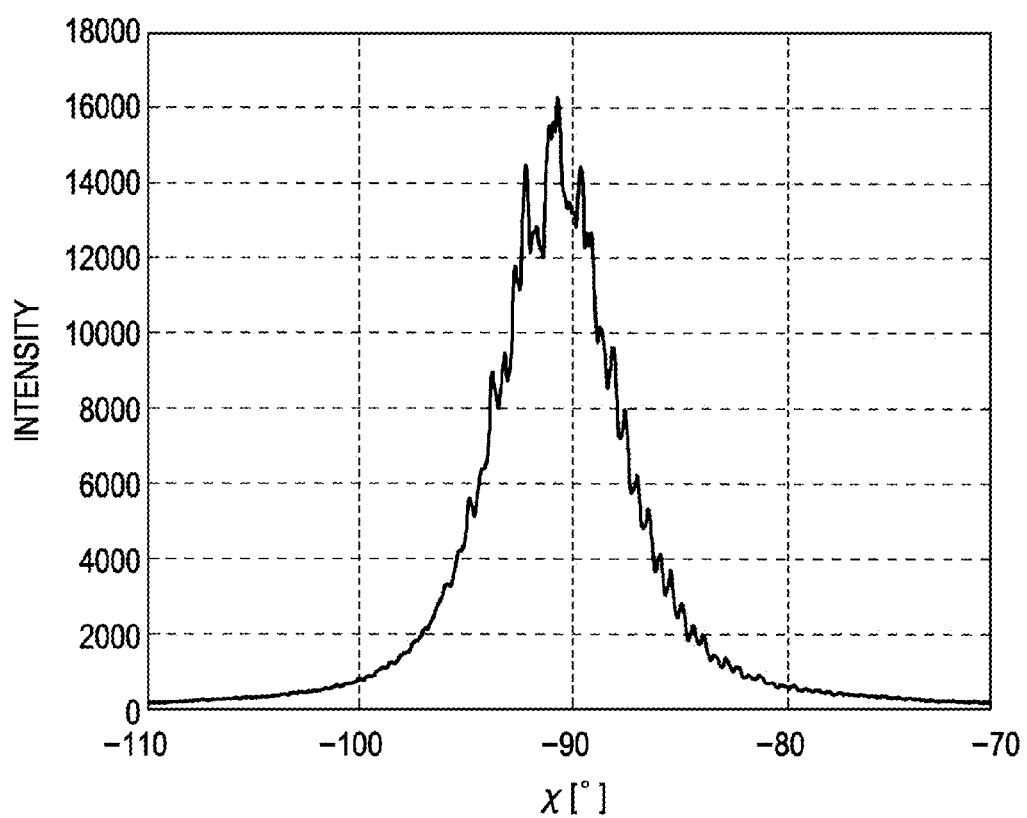
FIG. 29 is a graph showing the x scan of the (111) plane of a platinum film in Example 3.

The half-widths of the peaks derived from the (111) planes of the platinum layers of Examples 1 and 3 were determined by an X-ray rocking curve method. FIGS. 28 and 29 show the X scans of the (111) planes of the platinum layers of Examples 1 and 3, respectively. Example 1 had a relatively broad half-width of 14.825°, whereas Example 3 had a half-width of 5.786°, indicating that Example 3 has higher degrees of orientation and crystallinity of the platinum layer than Example 1.

Text Example 4

Figure 30A:
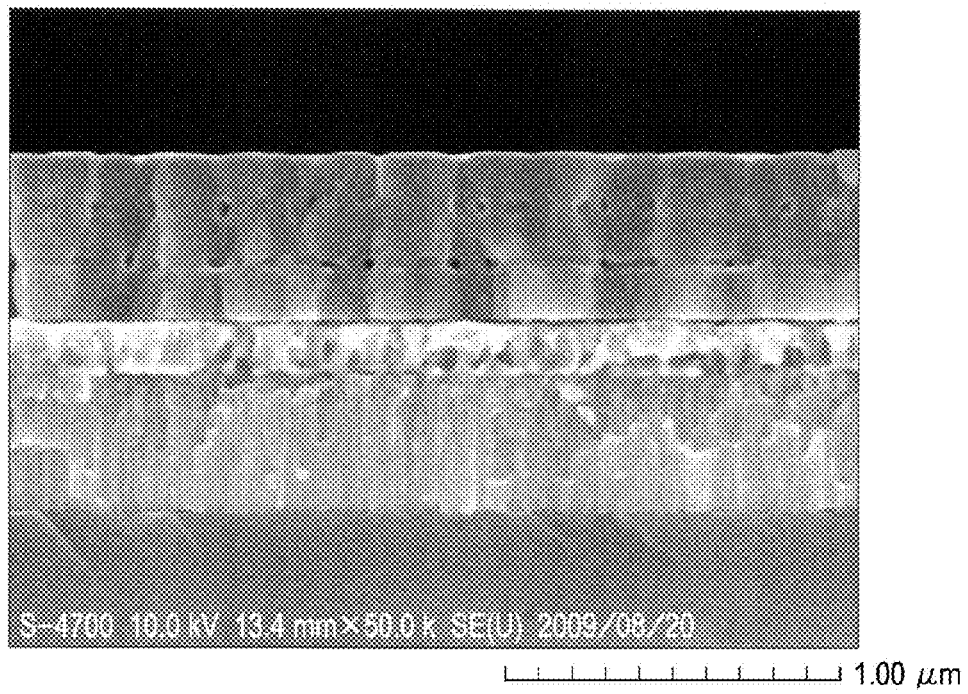
FIG. 30A is a SEM photograph of a cross section of Example 1.
Figure 30B:
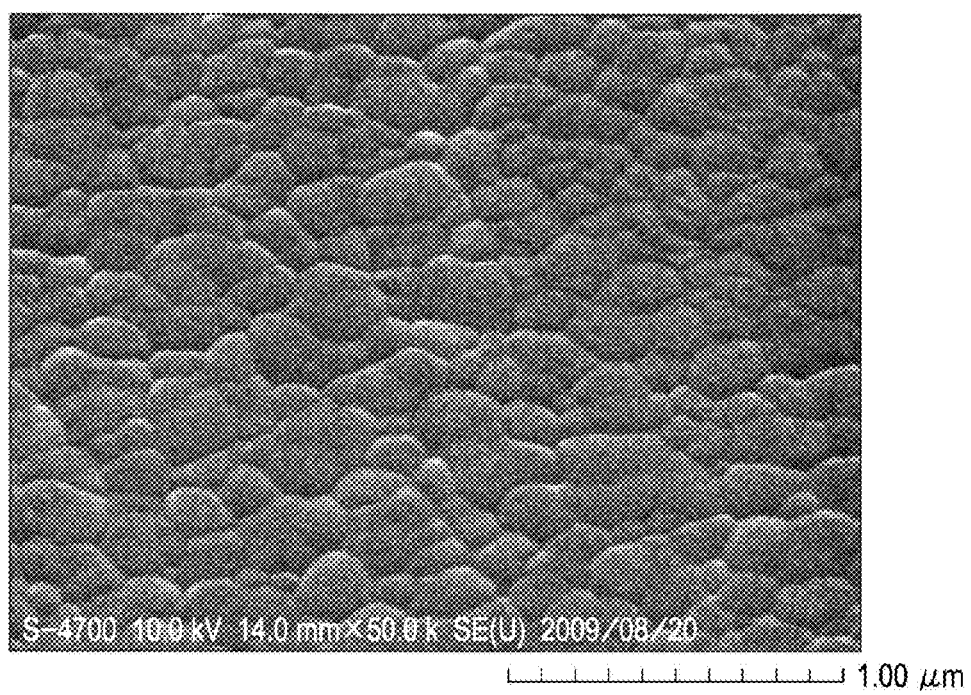
FIG. 30B is a SEM photograph of a surface of Example 1.
Figure 31A:
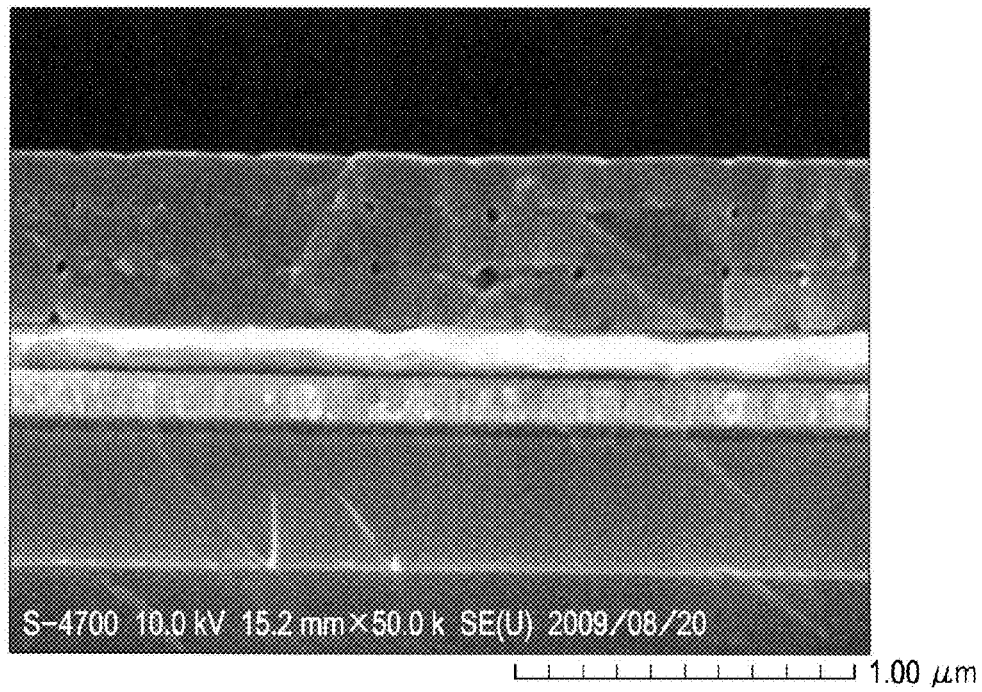
FIG. 31A is a SEM photograph of a cross section of Example 3.
Figure 31B:
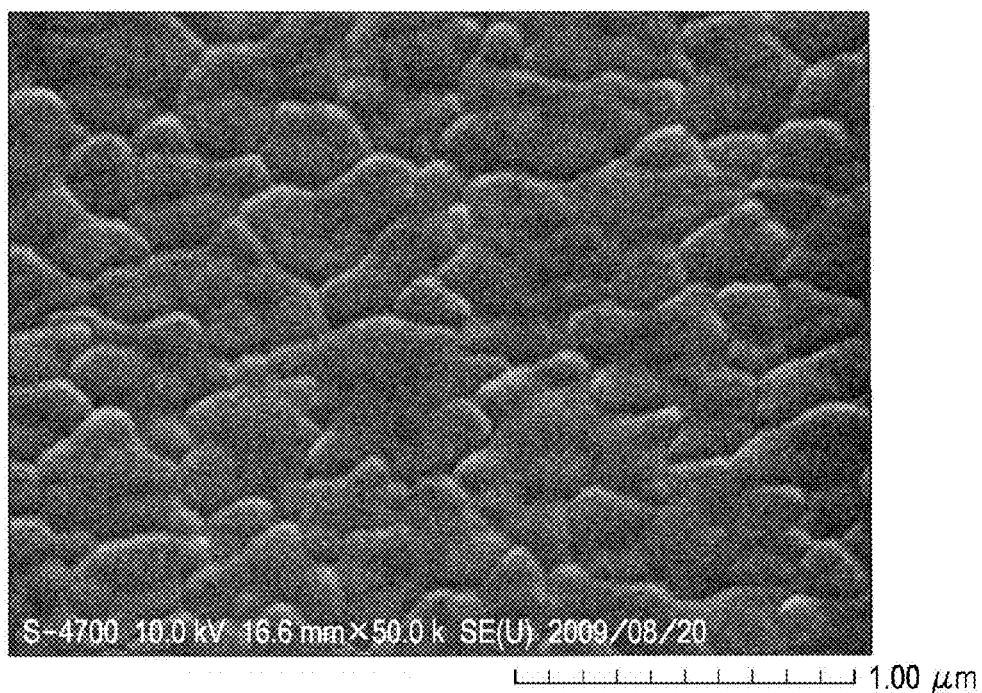
FIG. 31B is a SEM photograph of a surface of Example 3.

In Examples 1 and 3, before the second electrode was formed, a surface and a cross section were observed with a scanning electron microscope (SEM) at a magnification of 50,000. FIG. 30A is a SEM photograph of a cross section of Example 1. FIG. 30B is a SEM photograph of a surface of Example 1. FIG. 31A is a SEM photograph of a cross section of Example 3. FIG. 31B is a SEM photograph of a surface of Example 3. As shown in FIGS. 30A, 30B, 31A, and 31B, Examples 1 and 3 had fine, excellent morphology, although a small number of voids were observed at fired boundary surfaces.

Text Example 5

Figure 32A:
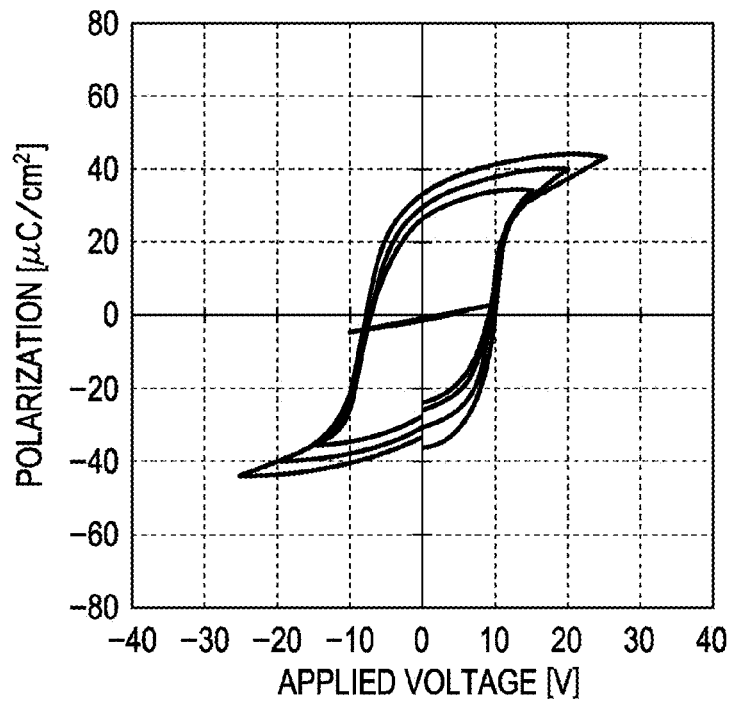
FIG. 32A is a graph showing P-V curves of Example 1.
Figure 32B:
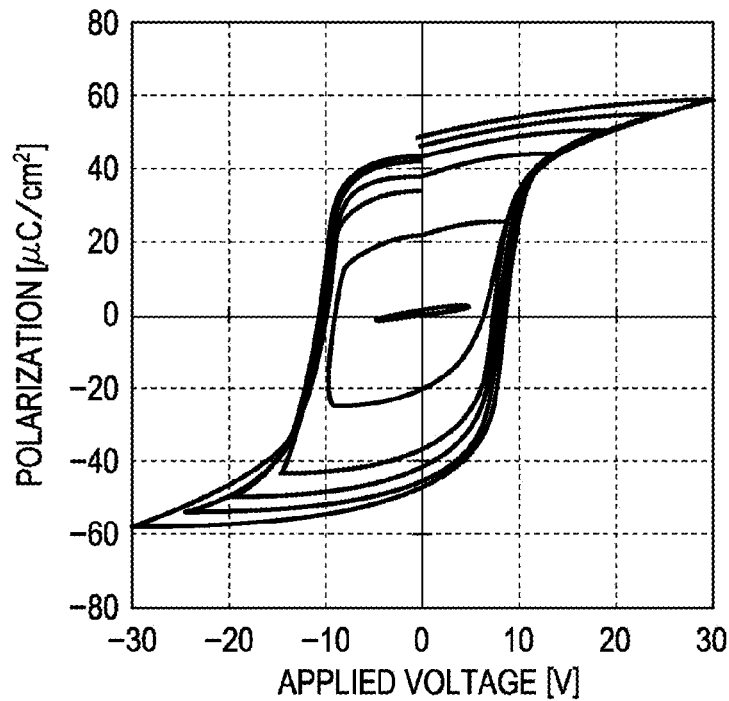
FIG. 32B is a graph showing P-V curves of Example 3.
Figure 32C:
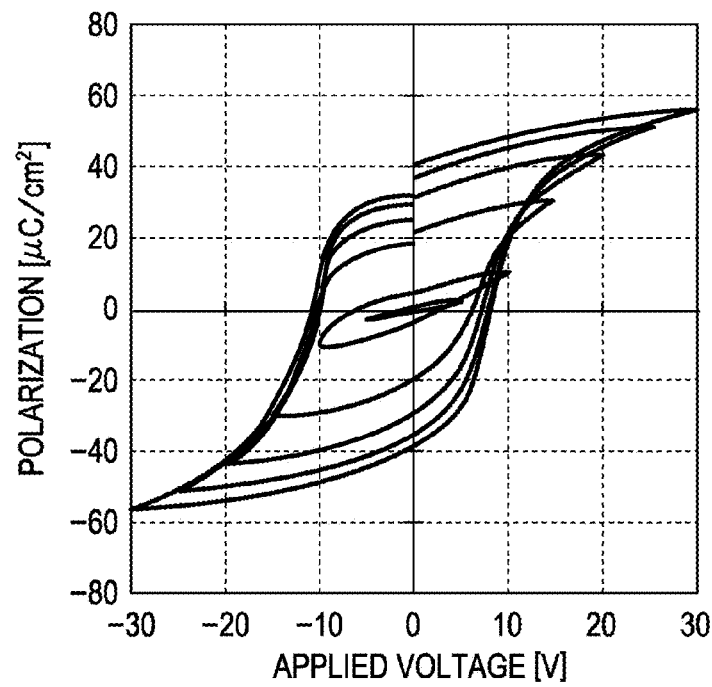
FIG. 32C is a graph showing P-V curves of Comparative Example 1.
Figure 32D:
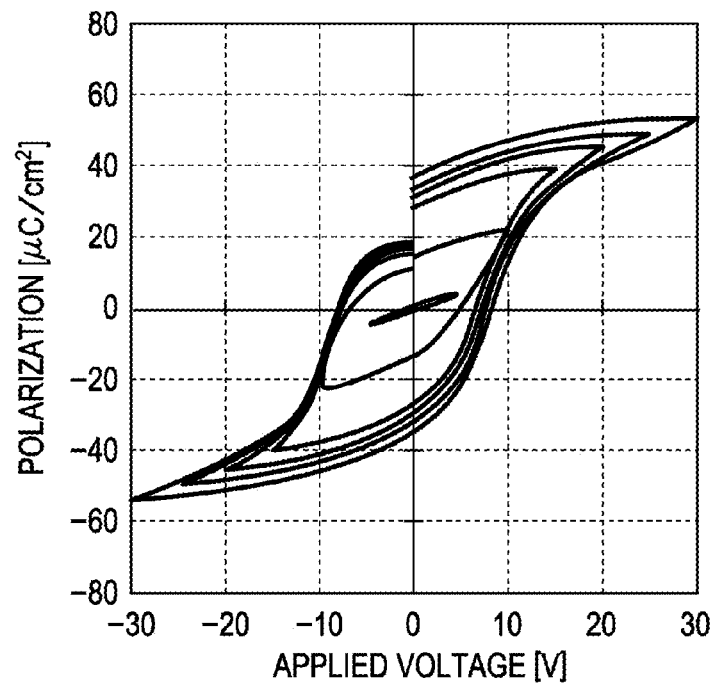
FIG. 32D is a graph showing P-V curves of Comparative Example 3.
Figure 33:
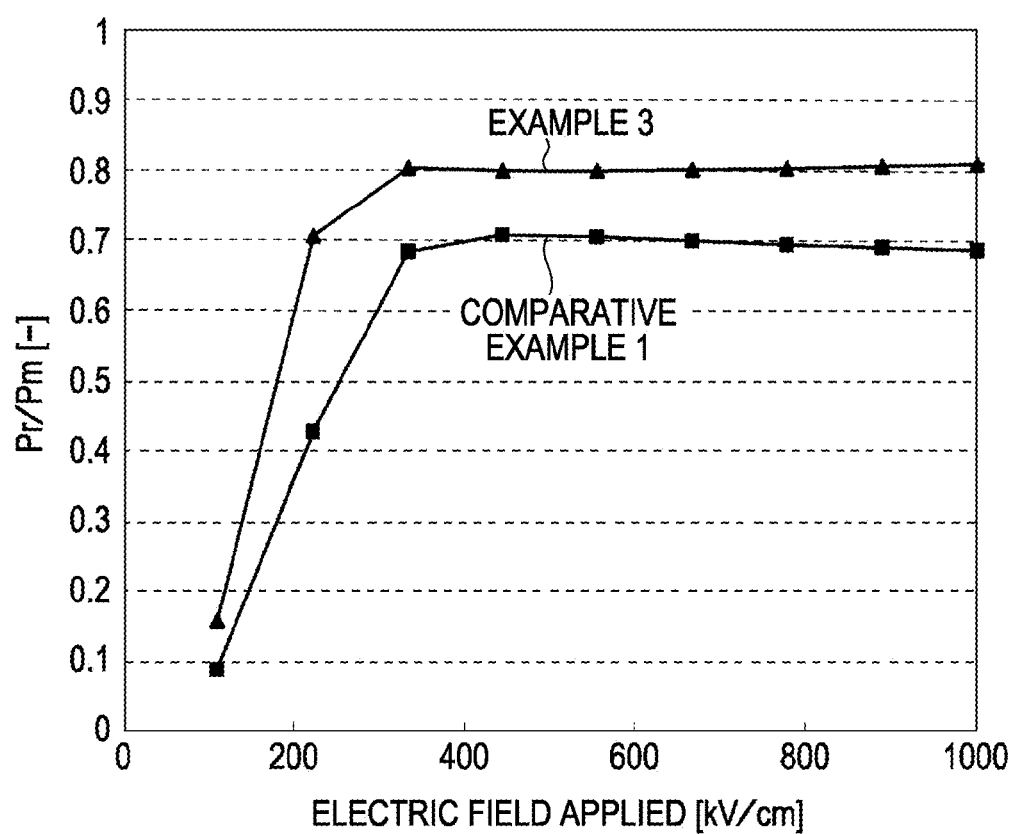
FIG. 33 is a graph showing Pr/Pm as a function of electric field applied in Example 3 and Comparative Example 1.

The relationship between the amount of polarization (P) and voltage (V) for the piezoelectric elements 300 according to Examples 1 and 3 and Comparative Examples 1 and 3 was determined at room temperature using a triangular wave at a frequency of 1 kHz in a ferroelectric test system "FCE-1A" manufactured by Toyo Co. with an electrode pattern of φ=400 μm. FIGS. 32A and 32B show the P-V curves of Examples 1 and 3, respectively. FIGS. 32C and 32D show the P-V curves of Comparative Examples 1 and 3, respectively. FIG. 33 shows the ratio of remanent polarization (Pr) to saturation polarization (Pm) as a function of electric field applied in Example 3 and Comparative Example 1. The remanent polarization (Pr) and the saturation polarization (Pm) were determined from FIG. 32B and 32C.

As shown in FIGS. 32A to 32D, Examples 1 and 3 and Comparative Examples 1 and 3 had a hysteresis loop characteristic of a ferroelectric substance. Example 3 had better squareness than Example 1 and Comparative Examples 1 and 3. Example 3 had no leakage and high insulating capacity. The electric-field-induced strain of the piezoelectric elements 300 according to Examples 1 and 3 and Comparative Examples 1 and 3 was determined at room temperature with a double-beam laser interferometer (DBLI) manufactured by aixACCT Systems using an electrode pattern of φ=500 μm at a frequency of 1 kHz. Deformation was observed in all of Examples 1 and 3 and Comparative Examples 1 and 3.

Other Embodiments

While the embodiments of the invention are described above, the basic constituent features of the invention are not limited to these embodiments. For example, although the basic component of the piezoelectric layer is the $ABO_3$ complex oxide only containing Bi, La, Fe, and Mn as metallic elements in the embodiments described above, the $ABO_3$ complex oxide may further contain another metal to improve the piezoelectric characteristics.

Furthermore, although the flow-passage-forming substrate 10 is a silicon single crystal substrate in the embodiments described above, the flow-passage-forming substrate 10 may be an SOI substrate or a glass substrate.

Furthermore, although the piezoelectric element 300 includes the first electrode 60, the piezoelectric layer 70, and the second electrode 80 on the substrate (the flow-passage-forming substrate 10) in the embodiments described above, a piezoelectric material and an electrode-forming material may be alternately stacked to manufacture a longitudinal vibration piezoelectric element, which expands and contracts in the axial direction.

Figure 34:
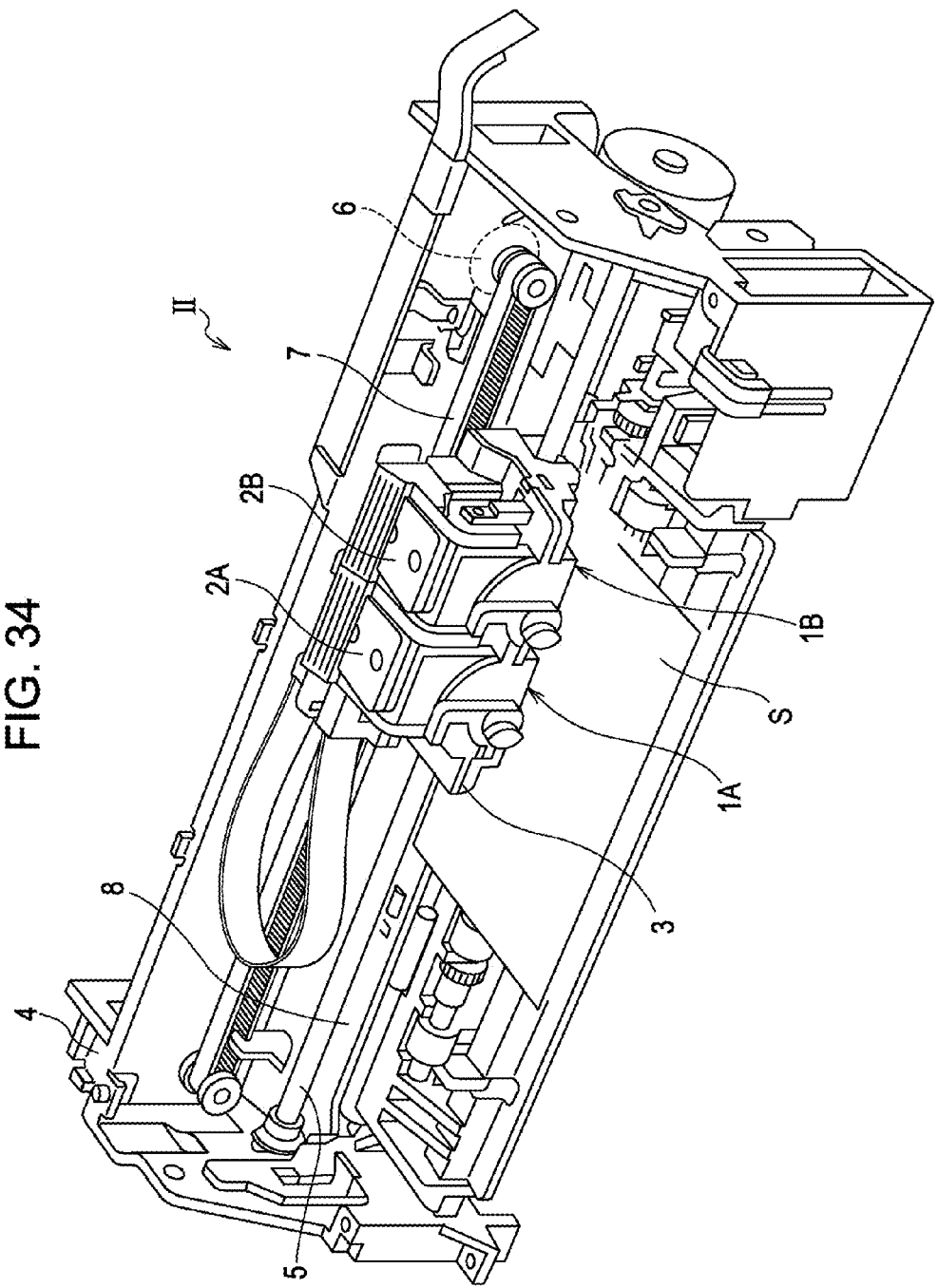
FIG. 34 is a schematic view of a printer according to one embodiment of the invention.

The ink jet print heads according to the embodiments described above can be installed in ink jet printers as one component of a print head unit that includes an ink path in communication with an ink cartridge. FIG. 34 is a schematic view of an ink jet printer according to an embodiment of the invention.

In an ink jet printer II illustrated in FIG. 34, print head units 1A and 1B include the ink jet print head I and house removable cartridges 2A and 2B. Each of the cartridges 2A and 2B constitutes an ink supply unit. A carriage 3 includes the print head units 1A and 1B and is mounted on a carriage shaft 5 attached to a main body 4 of the printer. The carriage 3 can move in the axial direction. For example, the print head units 1A and 1B can eject a black ink composition and a color ink composition, respectively.

When the driving force of a drive motor 6 is transferred to the carriage 3 via a plurality of gears (not shown) and a timing belt 7, the carriage 3 including the print head units 1A and 1B moves along the carriage shaft 5. The main body 4 of the printer includes a platen 8 along the carriage shaft 5. A sheet S, which is a recording medium, such as a paper sheet, can be fed by a feed roller (not shown) and transported over the platen 8.

While the ink jet print head has been described as an example of a liquid-ejecting head in the first embodiment, the invention is directed to a wide variety of general liquid-ejecting heads and, as a matter of course, can be applied to liquid-ejecting heads for ejecting liquid other than ink. Examples of other liquid-ejecting heads include recording heads for use in image recorders, such as printers, coloring-material-ejecting heads for use in the manufacture of color filters for liquid crystal displays, electrode-material-ejecting heads for use in the formation of electrodes for organic EL displays and field-emission displays (FED), and bioorganic-compound-ejecting heads for use in the manufacture of biochips.

The invention can be applied not only to piezoelectric elements installed in liquid-ejecting heads, such as ink jet print heads, but also to piezoelectric elements installed in other apparatuses, for example, ultrasonic devices, such as ultrasonic transmitters, ultrasonic motors, and pressure sensors.

What is claimed is:

1. A piezoelectric element comprising:
a first electrode,
a piezoelectric layer disposed above the first electrode and comprising a complex oxide having the following general formula

$$(Bi_{1-x},La_x)(Fe_{1-y},Mn_y)O_3 \quad (1)$$

$(0.10 \leq x \leq 0.20, 0.01 \leq y \leq 0.09)$, and a second electrode disposed above the piezoelectric layer, wherein the piezoelectric layer contains crystals preferentially oriented in a (111) plane.

2. The piezoelectric element according to claim 1, wherein the first electrode includes a platinum layer containing platinum and a strontium titanate (STO) layer containing strontium titanate disposed on the platinum layer, and the piezoelectric layer is disposed on the STO layer.

3. The piezoelectric element according to claim 2, wherein the STO layer is doped with Nb.

4. The piezoelectric element according to claim 1, wherein the first electrode includes a platinum layer containing platinum and a strontium ruthenate (SRO) layer containing strontium ruthenate disposed on the platinum layer, and the piezoelectric layer is disposed on the SRO layer.

5. The piezoelectric element according to claim 1, wherein the first electrode includes an iridium oxide layer containing iridium oxide and a platinum layer containing platinum disposed on the iridium oxide layer, and the piezoelectric layer is disposed on the platinum layer.

6. The piezoelectric element according to claim 1, wherein the first electrode includes a platinum layer containing platinum and having a half-width of the (111) plane of 10 degrees or less, and the piezoelectric layer is disposed on the platinum layer.

7. The piezoelectric element according to claim 1, wherein x is in the range of $0.17 \leq x \leq 0.20$.

8. The piezoelectric element according to claim 7, wherein x is in the range of $0.19 \leq x \leq 0.20$.

9. The piezoelectric element according to Claim 1, wherein y is in the range of $0.01 \leq y \leq 0.05$.

10. A liquid-ejecting head comprising the piezoelectric element according to claim 1.

11. A liquid-ejecting apparatus comprising the liquid-ejecting head according to claim 10.

12. A method for manufacturing a piezoelectric element including a piezoelectric layer which contains bismuth lanthanum iron and manganese, comprising:
    forming a STO precursor film on the platinum layer, the STO precursor film being a precursor of the STO layer;
    forming a piezoelectric precursor film on the STO precursor film, the piezoelectric precursor film being a precursor of the piezoelectric layer; and
    simultaneously firing the STO precursor film and the piezoelectric precursor film to form the STO layer and the piezoelectric layer.

13. A method for manufacturing the piezoelectric element according to claim 12, further comprising:
    forming the platinum layer on the iridium oxide layer;
    forming a piezoelectric precursor film on the platinum layer, the piezoelectric precursor film being a precursor of the piezoelectric layer; and
    firing the piezoelectric precursor film in an inert gas atmosphere to form the piezoelectric layer.

* * * * *